(12) United States Patent
Horiuchi et al.

(10) Patent No.: US 9,269,911 B2
(45) Date of Patent: Feb. 23, 2016

(54) ORGANIC LIGHT-EMITTING DEVICE

(75) Inventors: Takayuki Horiuchi, Tokyo (JP); Jun Kamatani, Tokyo (JP); Naoki Yamada, Inagi (JP); Kengo Kishino, Tokyo (JP); Akihito Saitoh, Gotemba (JP)

(73) Assignee: Canon Kabushiki Kaisha, Tokyo (JP)

(*) Notice: Subject to any disclaimer, the term of this patent is extended or adjusted under 35 U.S.C. 154(b) by 631 days.

(21) Appl. No.: 13/643,063

(22) PCT Filed: Apr. 19, 2011

(86) PCT No.: PCT/JP2011/060008
§ 371 (c)(1),
(2), (4) Date: Oct. 23, 2012

(87) PCT Pub. No.: WO2011/136156
PCT Pub. Date: Nov. 3, 2011

(65) Prior Publication Data
US 2013/0037791 A1 Feb. 14, 2013

(30) Foreign Application Priority Data

Apr. 26, 2010 (JP) .................................. 2010-101299
Oct. 8, 2010 (JP) .................................. 2010-228893

(51) Int. Cl.
*H01L 51/54* (2006.01)
*H01L 51/00* (2006.01)
(Continued)

(52) U.S. Cl.
CPC ........ *H01L 51/0073* (2013.01); *H01L 51/0054* (2013.01); *H01L 51/0058* (2013.01); *H01L 51/0074* (2013.01); *H05B 33/10* (2013.01); *C09K 2211/1007* (2013.01); *C09K 2211/1011* (2013.01); *C09K 2211/1029* (2013.01); *C09K 2211/1088* (2013.01);
(Continued)

(58) Field of Classification Search
CPC ............... C07D 311/86; C07D 409/14; H01L 51/0054; H01L 51/0058; H01L 51/0073; H01L 51/0074; H01L 51/50; H01L 51/5016; H01L 51/5072; H01L 51/5096; H01L 51/0065; C09K 11/06; C09K 2211/1088; C09K 2211/1092; H05B 33/10
See application file for complete search history.

(56) References Cited

U.S. PATENT DOCUMENTS 6,310,360 B1 * 10/2001 Forrest et al. .................... 257/40
2002/0074935 A1 * 6/2002 Kwong et al. ................. 313/504
2003/0072964 A1 * 4/2003 Kwong et al. ................. 428/690
(Continued)

FOREIGN PATENT DOCUMENTS

CN 1504821 A 6/2004
DE 4211420 A1 10/1993
(Continued)

OTHER PUBLICATIONS

Merkel et al. "Thermodynamic energies of donor and acceptor triplet states." Journal of Photochemistry and Photobiology A:Chemistry. vol. 193 pp. 110-121, 2008.*
(Continued)

*Primary Examiner* — Dawn L. Garrett
(74) *Attorney, Agent, or Firm* — Canon U.S.A. Inc., IP Division

(57) ABSTRACT

An organic light-emitting device that achieves highly efficient emission and low-voltage operation is provided. The organic light-emitting device contains a 9H-xanthen-9-one derivative.

18 Claims, 1 Drawing Sheet

(51) Int. Cl.
*H05B 33/10* (2006.01)
*H01L 51/50* (2006.01)

(52) U.S. Cl.
CPC .... *C09K 2211/1092* (2013.01); *H01L 51/5016* (2013.01); *H01L 51/5096* (2013.01)

(56) References Cited

U.S. PATENT DOCUMENTS

2007/0231601 A1* 10/2007 Nakasu et al. ............... 428/690
2009/0066226 A1 3/2009 Sugita
2012/0085997 A1 4/2012 Sugita et al.

FOREIGN PATENT DOCUMENTS

| EP | 1304750 A2 | 4/2003 |
| JP | 2007-284516 A | 11/2007 |
| WO | 2006/114966 A1 | 11/2006 |
| WO | 2010/150593 A1 | 12/2010 |
| WO | WO2012060234 A1 | 5/2012 |

OTHER PUBLICATIONS

Heinz, B. et al., "On the unusual fluorescence properties of xanthone in water", Physical Chemistry Chemical Physics, Jun. 26, 2006, vol. 8, pp. 3432-3439.

Nickel, Bernhard et al., "Delayed Fluorescence From Upper Excited Singlet States of Aromatic Ketones", Chemical Physics Letters, vol. 74, No. 2, Sep. 1, 1980, pp. 368-372.

Ireland, J.F. et al., "Excited Singlet and Triplet pK Values of Xanthones in Aqueous Solution", Department of Chemistry, The University of St. Andrews, Jan. 14, 1972, pp. 1053-1058.

* cited by examiner

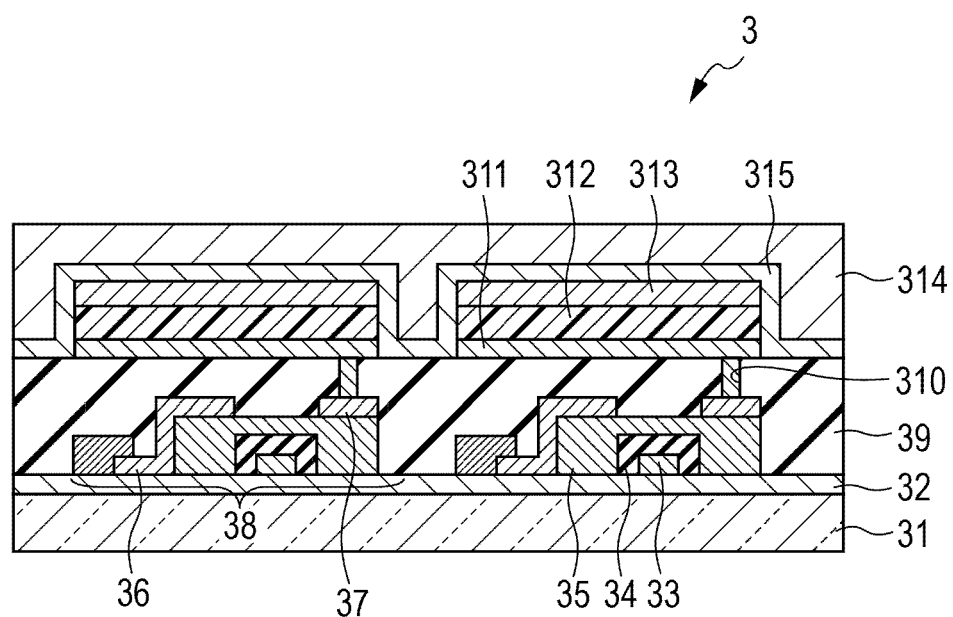

ORGANIC LIGHT-EMITTING DEVICE

TECHNICAL FIELD

The present invention relates to organic light-emitting devices.

BACKGROUND ART

An organic light-emitting device is a device that includes an anode, a cathode, and an organic compound layer interposed between the anode and the cathode. Holes and electrons injected from the respective electrodes of the organic light-emitting device are recombined in the organic compound layer to generate excitons and light is emitted as the excitons return to their ground state. The organic light-emitting device is also called an organic electroluminescent device or organic EL device. Recent years have seen remarkable advances in the field of organic light-emitting devices. Organic light-emitting devices offer low driving voltage, various emission wavelengths, rapid response, and small thickness and are light-weight.

Phosphorescence-emitting devices are a type of device that includes an organic compound layer containing a phosphorescence-emitting material, with triplet excitons contributing to emission. Creation of novel organic compounds has been actively pursued to provide high-performance phosphorescence-emitting devices.

PTL 1 discloses a compound 1 used as a host material of a phosphorescence-emitting device. The compound 1 is a xanthone derivative having carbazolyl groups.

[Chem. 1]

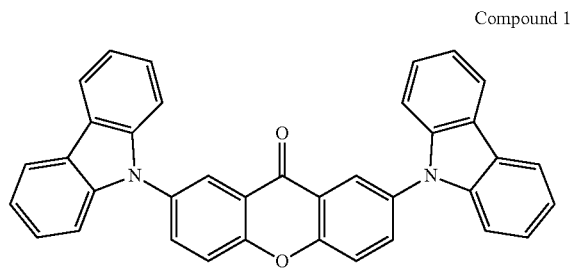

Compound 1

Since the excited triplet ($T_1$) energy of this compound is low, this material is not suitable as a host material of an emission layer of a blue or green phosphorescence-emitting device or as a material for forming a carrier transport layer.

CITATION LIST

Patent Literature

PTL 1: International Publication No. 2006/114966

SUMMARY OF INVENTION

The present invention provides an organic light-emitting device that uses a xanthone derivative having a high $T_1$ energy and good electron injectability so that an organic light-emitting device having high emission efficiency and low driving voltage is provided and used as a blue or green phosphorescence-emitting device.

According to an aspect of the present invention, an organic light-emitting device includes an anode, a cathode, and an emission layer composed of an organic compound and interposed between the anode and the cathode. The emission layer contains a phosphorescence-emitting material. The organic light-emitting device contains a xanthone compound represented by general formula [1]:

[Chem. 2]

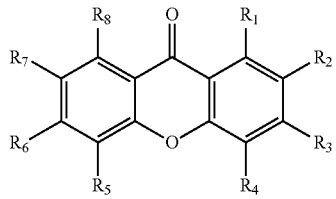

[1]

In general formula [1], $R_1$ to $R_8$ are each independently selected from a hydrogen atom, an alkyl group having 1 to 4 carbon atoms, a substituted or unsubstituted phenyl group, a substituted or unsubstituted naphthyl group, a substituted or unsubstituted phenanthryl group, a substituted or unsubstituted fluorenyl group, a substituted or unsubstituted triphenylenyl group, a substituted or unsubstituted chrysenyl group, a substituted or unsubstituted dibenzofuranyl group, and a substituted or unsubstituted dibenzothienyl group.

According to the present invention, an organic light-emitting device having high emission efficiency and low driving voltage can be provided by using a xanthone derivative having high $T_1$ energy and good electron injectability.

BRIEF DESCRIPTION OF DRAWINGS

FIG. 1 is a schematic cross-sectional view of an organic light-emitting device and a switching element connected to the organic light-emitting device.

DESCRIPTION OF EMBODIMENTS

An organic light-emitting device according to an embodiment of the present invention includes an anode, a cathode, and an emission layer composed of an organic compound and interposed between the anode and the cathode. The emission layer contains a phosphorescence-emitting material. The organic light-emitting device contains a xanthone compound represented by general formula [1]:

[Chem. 3]

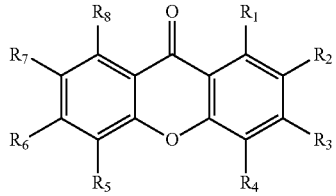

[1]

In formula [1], $R_1$ to $R_8$ are each independently selected from a hydrogen atom, an alkyl group having 1 to 4 carbon atoms, a substituted or unsubstituted phenyl group, a substituted or unsubstituted naphthyl group, a substituted or unsubstituted phenanthryl group, a substituted or unsubstituted fluorenyl group, a substituted or unsubstituted triphenylenyl group, a substituted or unsubstituted chrysenyl group, a substituted or unsubstituted dibenzofuranyl group, and a substituted or unsubstituted dibenzothienyl group.

Examples of the alkyl group having 1 to 4 carbon atoms include a methyl group, an ethyl group, a normal propyl group, an isopropyl group, a normal butyl group, a secondary butyl group, an isobutyl group, and a tertiary butyl group.

Examples of the substituents that may be included in the phenyl group, the naphthyl group, the phenanthryl group, the fluorenyl group, the triphenylenyl group, the chrysenyl group, the dibenzofuranyl group, and the dibenzothienyl group are as follows.

Examples of the substituents are a methyl group, an ethyl group, a normal propyl group, an isopropyl group, a normal butyl group, a secondary butyl group, an isobutyl group, and a tertiary butyl group; a phenyl group, a methylphenyl group, a dimethylphenyl group, a trimethylphenyl group, a pentamethylphenyl group, a triisopropylphenyl group, a tertiary butylphenyl group, a di-tertiary butyl phenyl group, a naphthylphenyl group, a phenanthrylphenyl group, a fluorenylphenyl group, a triphenylenylphenyl group, a chrysenylphenyl group, a dibenzofuranylphenyl group, a dibenzothienylphenyl group, and a 9,9'-spirobi[fluoren]-ylphenyl group; a biphenyl group, a di-tertiary butyl biphenyl group, a naphthylbiphenyl group, a phenanthrylbiphenyl group, a fluorenylbiphenyl group, a triphenylenylbiphenyl group, a chrysenylbiphenyl group, a dibenzofuranylbiphenyl group, and a dibenzothienylbiphenyl group; a naphthyl group, a di-tertiary butylnaphthyl group, a phenylnaphthyl group, and a biphenylnaphthyl group; a phenanthryl group, a phenylphenanthryl group, and a biphenylphenanthryl group; a fluorenyl group, a phenylfluorenyl group, a biphenylfluorenyl group, and a 9,9'-spirobi[fluoren]-yl group; a chrysenyl group, a phenylchrysenyl group, and a biphenylchrysenyl group; a triphenylenyl group, a phenyltriphenylenyl group, and a biphenyltriphenylenyl group; a dibenzofuranyl group, a tertiary butyldibenzofuranyl group, a di-tertiary butyldibenzofuranyl group; a phenyldibenzofuranyl group, a biphenyldibenzofuranyl group, a naphthyldibenzofuranyl group, a phenanthryldibenzofuranyl group, a fluorenyldibenzofuranyl group, a chrysenylbenzofuranyl group, and a triphenylenyldibenzofuranyl group; and a dibenzothienyl group, a tertiary butyldibenzothienyl group, a di-tertiary butyldibenzothienyl group, a phenyldibenzothienyl group, a biphenyldibenzothienyl group, a naphthyldibenzothienyl group, a phenanthryldibenzothienyl group, a fluorenyldibenzothienyl group, a chrysenyldibenzothienyl group, and a triphenylenyldibenzothienyl group.

Properties of Xanthone Compound

Since a xanthone skeleton contains a carbonyl group, it has high electron affinity. Since a xanthone skeleton is a planar skeleton, molecular overlap easily occurs and intermolecular electron migration occurs highly efficiently in a solid state. The xanthone compound having such properties is suited to carrying out injection and transport of electrons from the cathode or the adjacent organic layer when it is used in an organic light-emitting device. In other words, a xanthone compound is suited for use in an electron injection/transport layer and as a host in an emission layer.

Another feature of the xanthone skeleton is its high $T_1$ energy. A phosphorescent spectrum of a diluted toluene solution of unsubstituted xanthone (compound represented by formula [1] above with $R_1$ to $R_8$ each representing a hydrogen atom) was taken at 77 K, and the $T_1$ energy was determined from a 0-0 band. The $T_1$ energy was 3.02 eV (410 nm), which is sufficiently higher than that of blue (maximum peak wavelength in an emission spectrum is 440 nm to 480 nm). Accordingly, the xanthone compound may be used as a host of an emission layer or in a carrier transport layer adjacent to the emission layer in a phosphorescence-emitting device using a blue to red (600 nm to 620 nm) phosphorescence-emitting material.

In sum, a xanthone compound is suitable for use as a host of an emission layer and/or in an electron transport layer adjacent to the emission layer in a phosphorescence-emitting device.

When the xanthone compound is used as a host material of an emission layer of a phosphorescence-emitting device, the xanthone compound easily receives electrons from an electron transport layer and efficiently transports the electrons within the host (low voltage). Thus, the xanthone compound can give high $T_1$ energy generated by recombination of electrons and holes to the phosphorescence-emitting material without loss (high efficiency).

When the xanthone compound is used in an electron transport layer adjacent to the emission layer, the xanthone compound easily receives electrons from the cathode or an electron injection layer and transports the electrons to the emission layer (low voltage). Since the $T_1$ energy of the phosphorescence-emitting material in an excited state does not migrate to the xanthone compound in the electron transport layer adjacent to the emission layer, the $T_1$ energy is confined in the emission layer, thereby increasing the efficiency of the phosphorescence-emitting device. When the xanthone compound is used as a host of an emission layer and in an electron transport layer adjacent to the emission layer in a phosphorescence-emitting device, the lowest unoccupied molecular orbital (LUMO) energy barrier between the emission layer and the electron transport layer disappears and the effect of decreasing the voltage can be enhanced.

Regarding Substituents to be Introduced into Xanthone Compound

Introducing an alkyl group or an aromatic ring group into a highly planar compound such as a xanthone skeleton improves the solubility in a solvent, the sublimation property during vacuum deposition, and the amorphous property in a thin film state. However, since the sublimation property is degraded when an alkyl group has too many carbon atoms, the number of carbon atoms in the alkyl group may be 1 to 4.

In order to use the xanthone compound as a host of an emission layer and/or in an electron transport layer adjacent to the emission layer in a phosphorescence-emitting device, the xanthone compound desirably has a $T_1$ energy higher than that of the phosphorescence-emitting material. In other words, when the emission color of the phosphorescence-emitting material is blue to red (440 nm to 620 nm), it is important that the $T_1$ energy of the xanthone compound be decided according to the emission color of the phosphorescence-emitting material. In general, alkyl substituents little affect the $T_1$ energy but aromatic ring substituents greatly affect the $T_1$ energy of the compound as a whole. Thus, in deciding the $T_1$ energy of the xanthone compound, the $T_1$ energy of the aromatic ring substituent bonded to one of $R_1$ to $R_8$ in general formula [1] is extensively studied.

Table 1 shows the $T_1$ energy (on a wavelength basis) of each of major aromatic rings. Of these, preferred structures of the aromatic ring are benzene, naphthalene, phenanthrene, fluorene, triphenylene, chrysene, dibenzofuran, dibenzothiophene, and pyrene.

When the phosphorescence-emitting material has a blue to green range (440 nm to 530 nm) by utilizing the high $T_1$ energy property of the xanthone skeleton, preferable aromatic ring structures bonded to one of $R_1$ to $R_8$ of the xanthone compound are benzene, naphthalene, phenanthrene, fluorene, triphenylene, chrysene, dibenzofuran, and dibenzothiophene.

The substituents of the aromatic ring structures described above may further contain substituents as long as the $T_1$ energy of the xanthone compound is not significantly lowered.

TABLE 1

| | Structural formula | $T_1$ energy on a wavelength basis |
|---|---|---|
| Benzene | | 339 nm |
| Naphthalene | | 472 nm |
| Phenanthrene | | 459 nm |
| Fluorene | | 422 nm |
| Triphenylene | | 427 nm |

TABLE 1-continued

| | Structural formula | $T_1$ energy on a wavelength basis |
|---|---|---|
| Chrysene | | 500 nm |
| Dibenzofuran | | 417 nm |
| Dibenzothiophene | | 415 nm |
| Anthracene | | 672 nm |
| Pyrene | | 589 nm |

Note that the compound 1 described above is a compound having a xanthone skeleton into which an N-carbazolyl group is introduced. In order to predict the $T_1$ energy of the compound 1, a molecular orbital calculation of the B3LYP/6-31G* level was performed based on a density functional theory. The calculation was also conducted on the xanthone compound represented by general formula [1] above, and the results are compared with the phosphorescent spectrum measurement results of a diluted toluene solution. Table 2 shows the results.

TABLE 2

| | Structure | $T_1$ energy on a wavelength basis (calculated) | $T_1$ energy on a wavelength basis (observed) |
|---|---|---|---|
| Example Compound A-4 | | 423 nm | 439 nm |

TABLE 2-continued

| Structure | $T_1$ energy on a wavelength basis (calculated) | $T_1$ energy on a wavelength basis (observed) |
|---|---|---|
| Example Compound A-15 | 444 nm | 487 nm |
| Example Compound A-12 | 467 nm | 502 nm |
| Compound 1 | 486 nm | — |

The difference between the calculated value and the observed value of the $T_1$ energy of the three xanthone compounds of embodiments of the present invention was from 16 to 35 nm. Example Compound A-12 exhibited a $T_1$ energy observed value equal to the limitation value at which the compound can be used as a host in an emission layer or in an electron transport layer adjacent to the emission layer in a green phosphorescence-emitting device. In contrast, the compound 1 exhibited a calculated value 19 nm longer than that of Example Compound A-12; therefore, the observed value is assumed to be about 520 to 530 nm. The host of the emission layer or the material used in a carrier transport layer adjacent to the emission layer may have an energy about 20 nm higher than that of the emission material in terms of wavelength. However, since the compound 1 has a $T_1$ energy about the same as the emission wavelength (500 to 530 nm) of a green phosphorescence-emitting material, the energy of the green phosphorescence-emitting material may migrate to the compound 1 and the emission efficiency of the phosphorescence-emitting device may be lowered. Accordingly, the compound 1 is not suited for use as a host in an emission layer or in a carrier transport layer adjacent to the emission layer of a phosphorescence-emitting device for a wavelength shorter than green, and is thus not favored due to its narrow application range.

The reasons therefor is investigated by focusing on the electron distribution determined by a molecular orbital calculation. In the compound 1, the highest occupied molecular orbital (HOMO) is localized on the N-carbazolyl group and the LUMO is localized on the xanthone skeleton. This causes the compound 1 to enter a charge-transfer (CT) excited state and significantly decreases the excited singlet ($S_1$) and $T_1$ energies. In order for the xanthone skeleton to maintain a high $T_1$ energy, introduction of substituents, such as a carbazolyl group, that have a high HOMO energy level is avoided.

It is not desirable to introduce an electron-donating substituent such as an amino group since the electron acceptability of the xanthone skeleton may be degraded.

The position into which the substituent is to be introduced is at least one selected from $R_1$ to $R_8$ in general formula [1] to obtain desired physical property values.

The chemical stability of the compound can be further enhanced by introducing a substituent into a high-electron-density carbon atom on an aromatic ring. In the xanthone skeleton, the para position from the position at which an ether oxygen atom is bonded is susceptible to electrophilic reaction and has a high electron density. Thus, an alkyl group or an aromatic ring group is preferably introduced to at least one of $R_2$ and $R_7$ and more preferably to both $R_2$ and $R_7$ with the rest of Rs, i.e., $R_1$, $R_3$ to $R_6$, and $R_8$, being hydrogen atoms. Most preferably, the $R_2$ and $R_7$ are the same substituents.

Examples of the Xanthone Compound
Examples of the xanthone compound are described below in Groups A to C.
[Chem. 4]
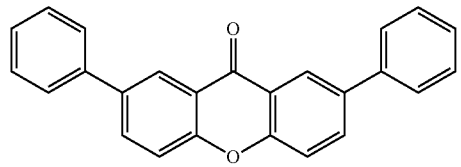
A-1
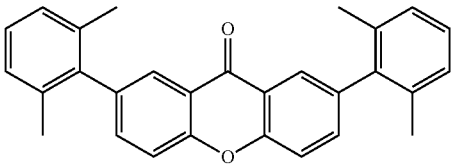
A-2
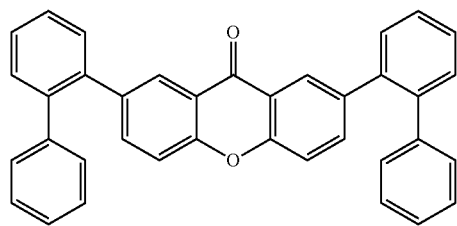
A-3
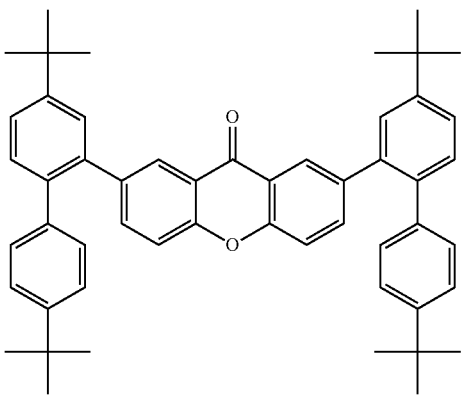 [SMILES: CC(C)(C)c1ccc(-c2ccc(C(C)(C)C)cc2-c2ccc3oc4ccc(-c5cc(C(C)(C)C)ccc5-c5ccc(C(C)(C)C)cc5)cc4c(=O)c3c2)cc1]
A-4
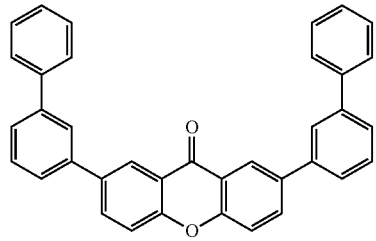
A-5
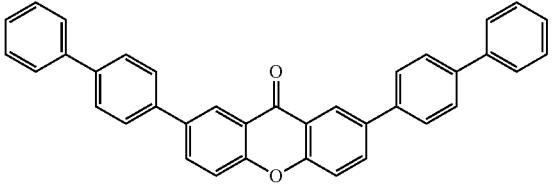
A-6
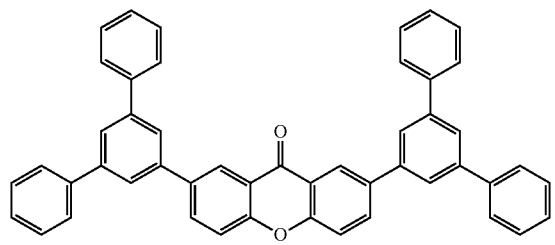
A-7
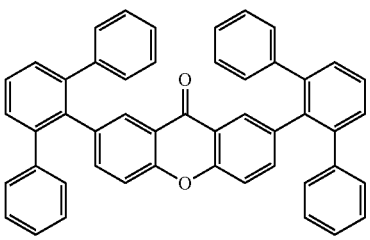
A-8
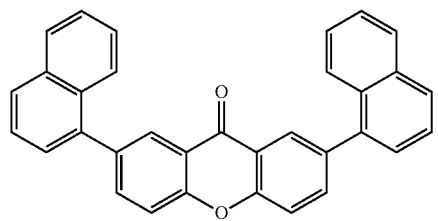
A-9
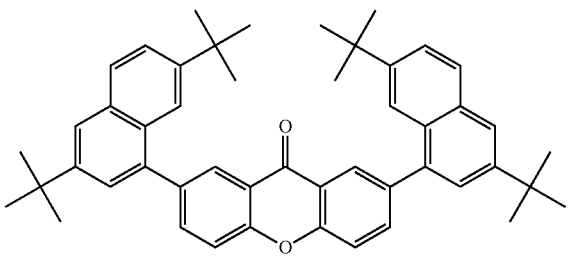
A-10

-continued
A-11
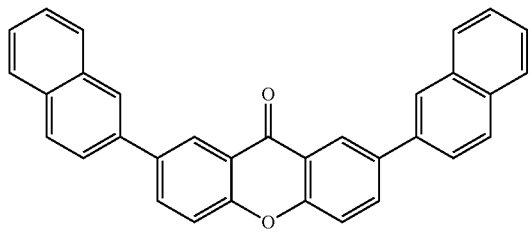
A-12
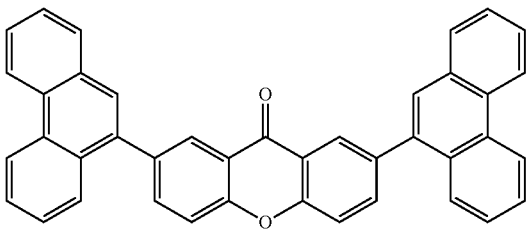 [SMILES: O=c1c2cc(-c3cc4ccccc4c4ccccc34)ccc2oc2ccc(-c3cc4ccccc4c4ccccc34)cc12]
A-13
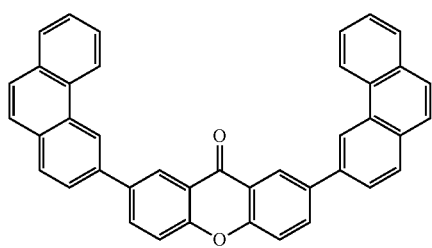
A-14
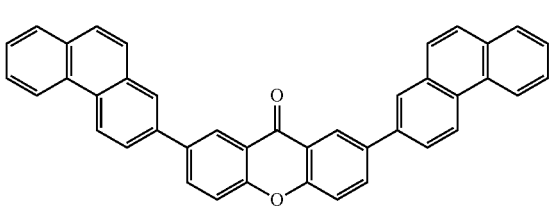
A-15
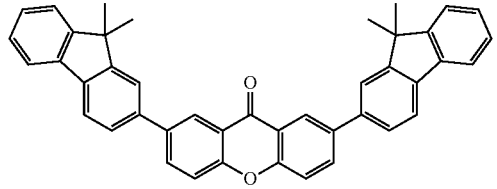
A-16
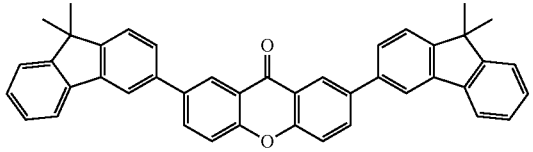
[Chem. 5]
A-17
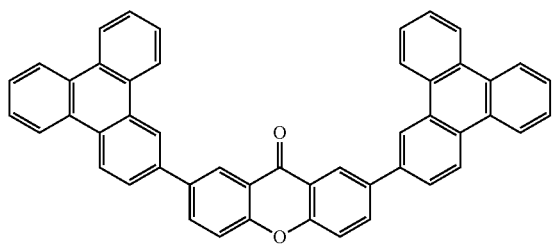
A-18
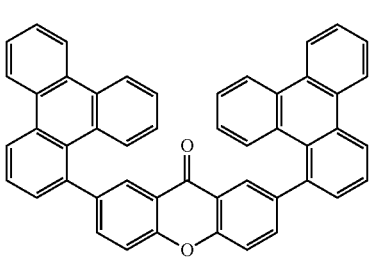
A-19
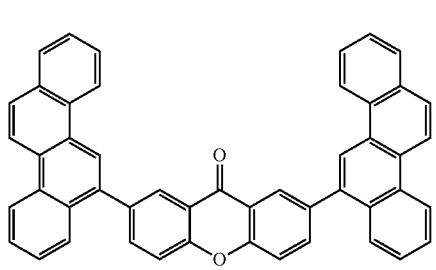
A-20
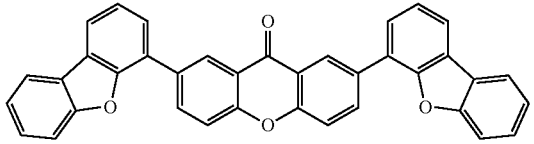
A-21
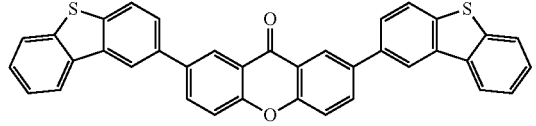
A-22
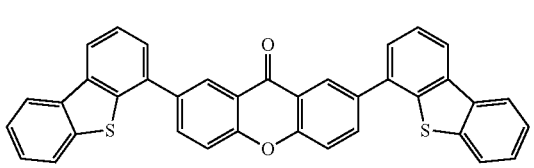
A-23
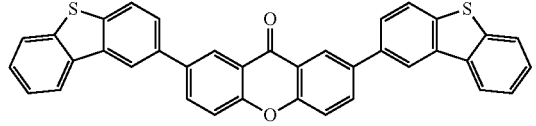
A-24
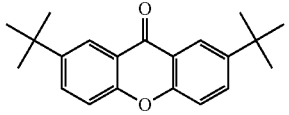

-continued
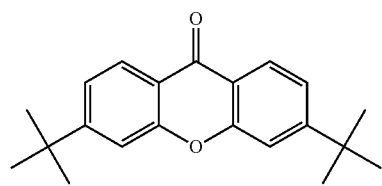
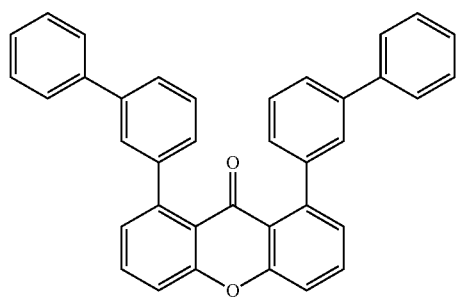
A-25
A-26
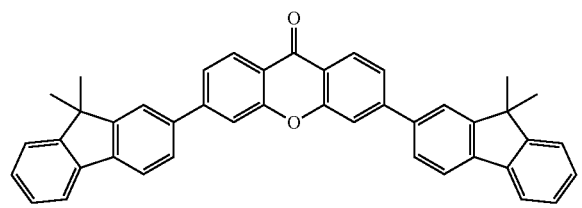
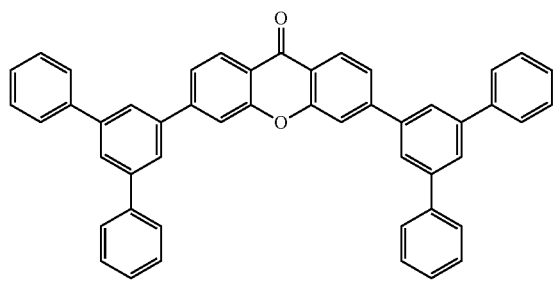
A-27
A-28
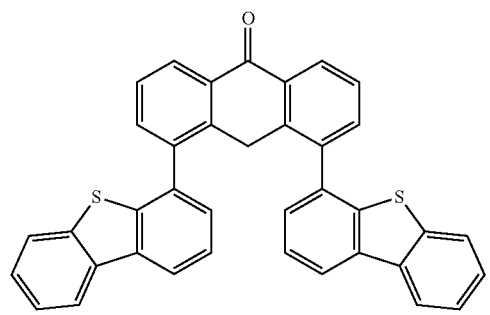
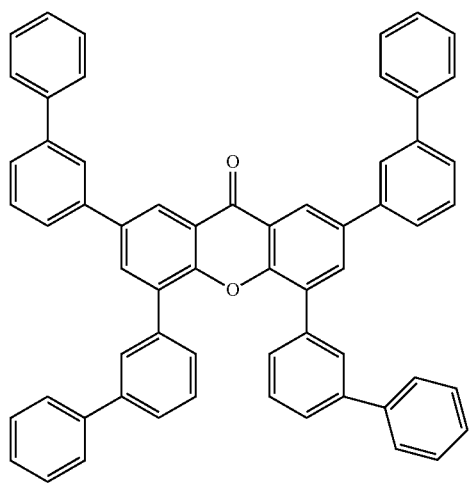
A-29
A-30
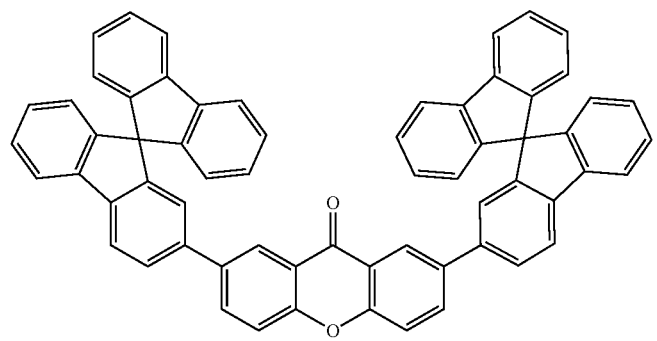
A-31

-continued
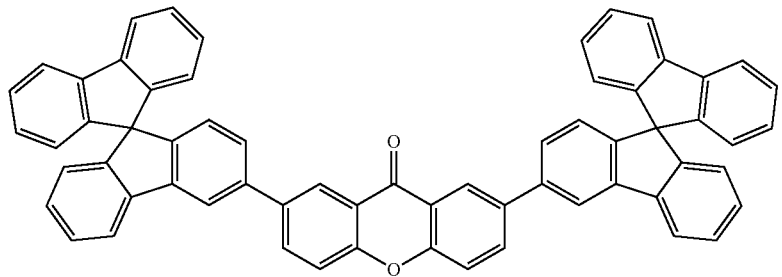
A-32
[Chem.6]
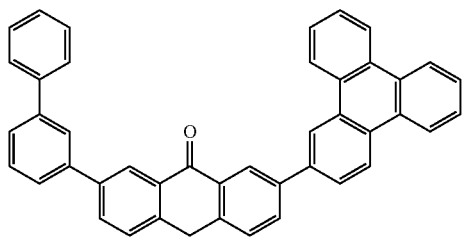
B-1
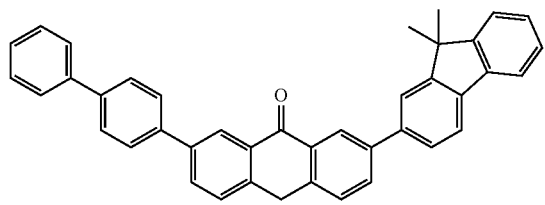
B-2
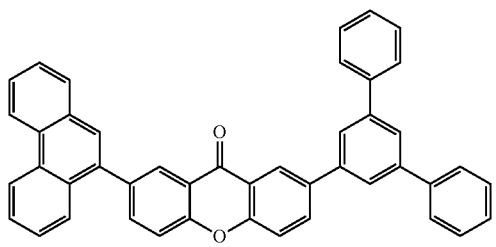
B-3
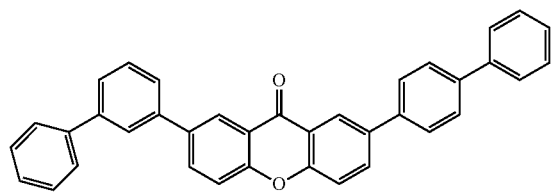
B-4
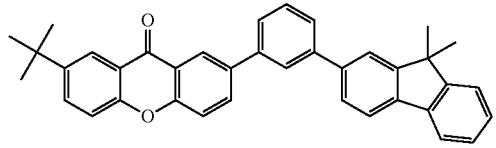
B-5
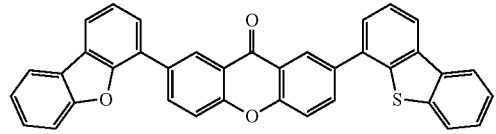
B-6
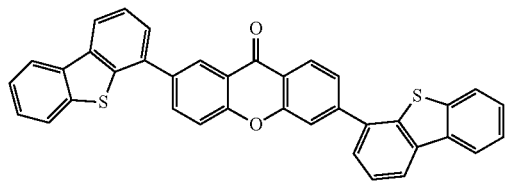
B-7
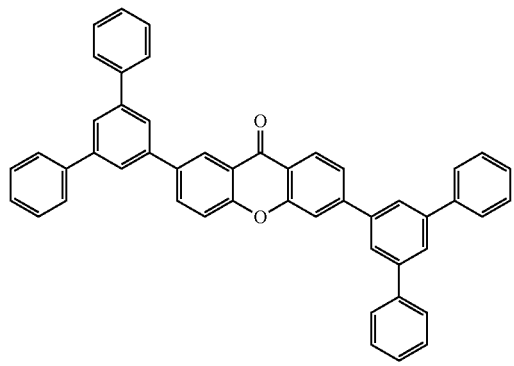
B-8

-continued
B-9
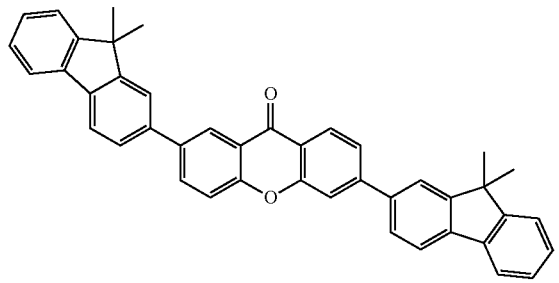
B-10
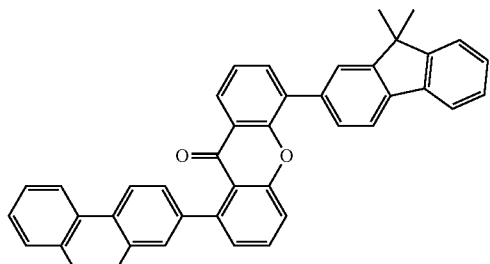
B-11
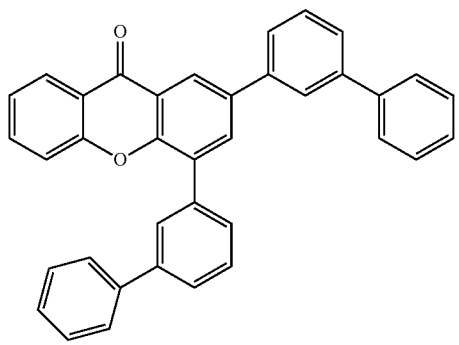
B-12
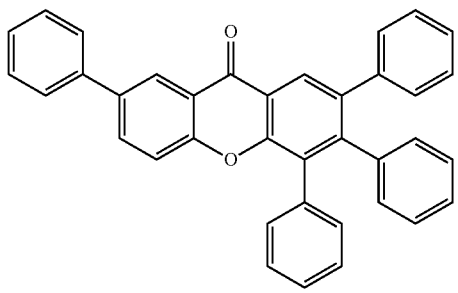
[Chem. 7]
C-1
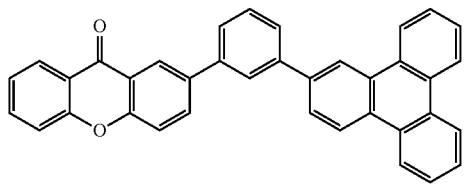
C-2
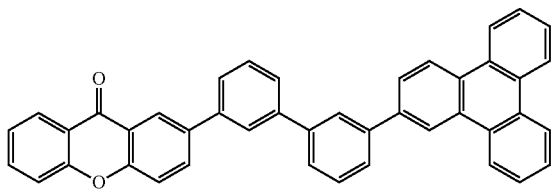
C-3
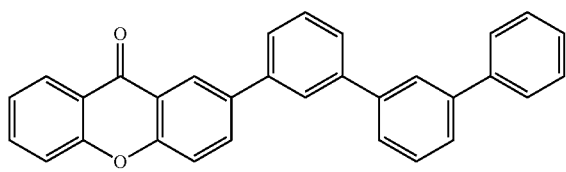
C-4
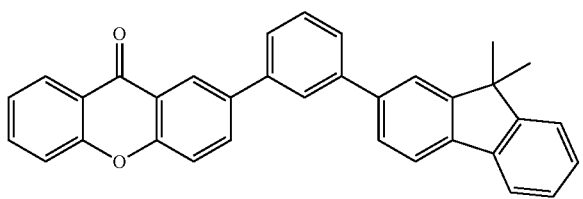
C-5
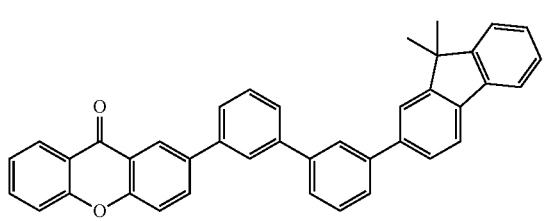
C-6
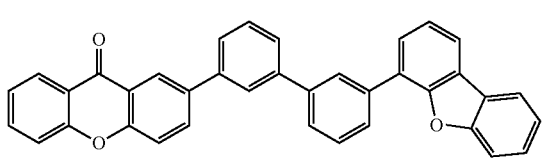
C-7
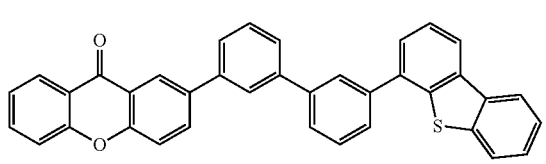
C-8
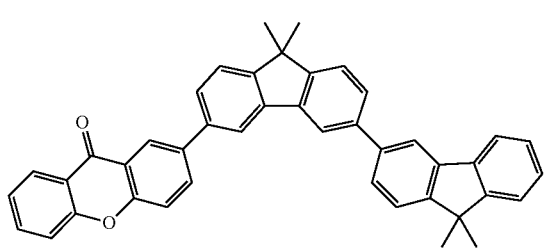

-continued

C-9
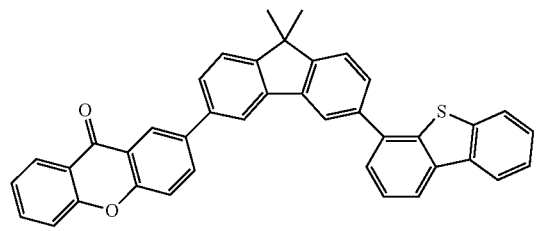

C-10
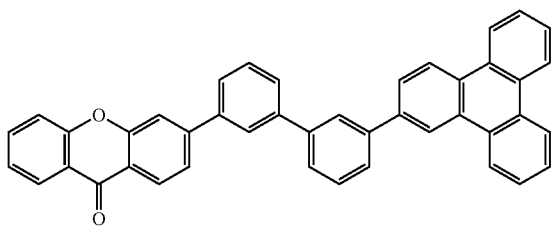

C-11
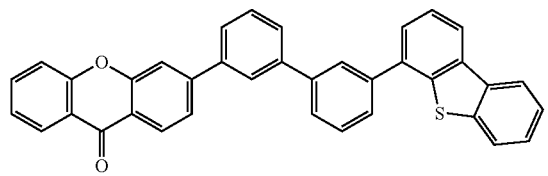

C-12
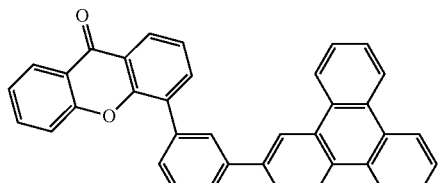

C-13
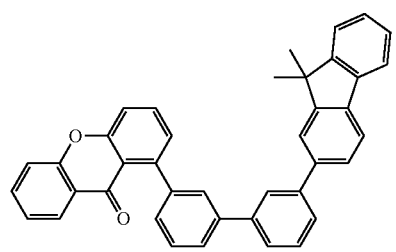

C-14
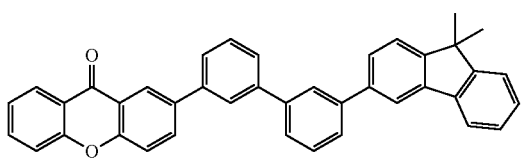

C-15
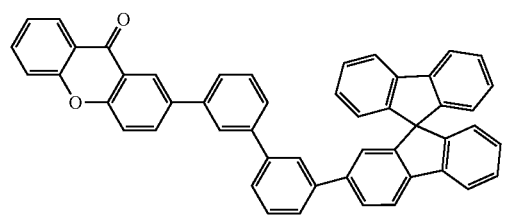

C-16
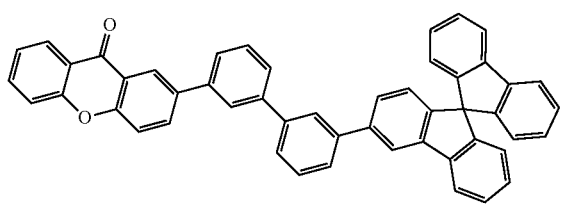

Properties of Example Compounds

Of the example compounds, those of Group A have an axis of symmetry within a molecule and two substituents of the same kind are respectively introduced into two benzene rings in a symmetrical manner. Thus, the electron distribution in the xanthone skeleton is unbiased and is thus stable.

Example compounds of Group B each have two or more substituents introduced into the xanthone skeleton and no axis of symmetry. These compounds achieve higher stability in an amorphous state. The physical property values can be finely adjusted by changing the position and type of the substituents.

Example compounds of Group C each have one substituent introduced therein. Since the high $T_1$ energy of the xanthone skeleton remains relatively undegraded, these compounds are particularly suited for use in blue or green phosphorescence-emitting devices.

Description of Synthetic Route

An example of a synthetic route for an organic compound is described. The reaction scheme therefor is presented below.

First, a halide, a triflate, and a boronic acid ester can be synthesized by using widely commercially available xanthone and its derivatives.

[Chem. 8]

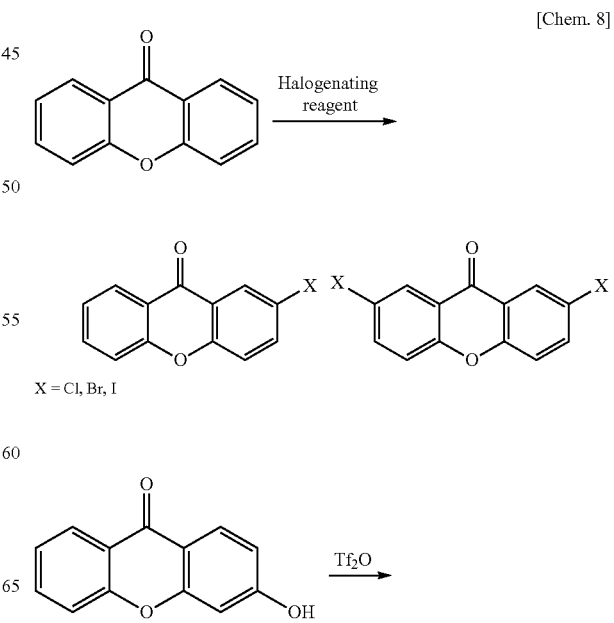

-continued

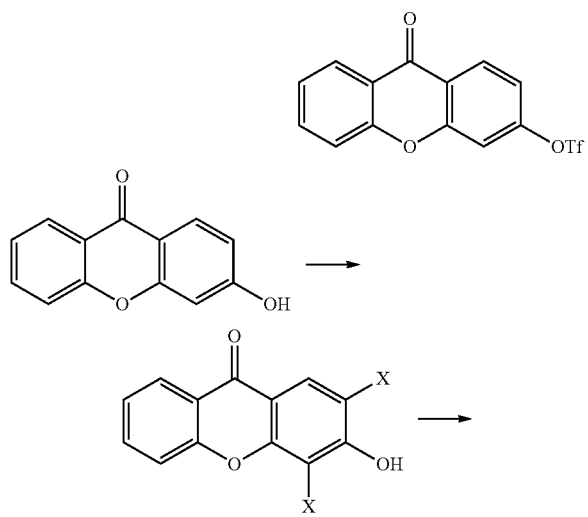

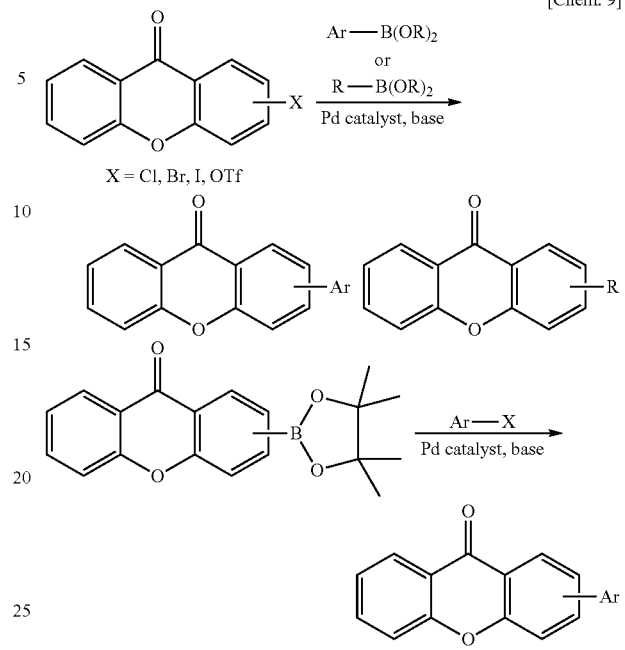

X = Cl, Br, I, OTf

A Friedel-Crafts reaction may be employed to introduce an alkyl group into a xanthone skeleton.

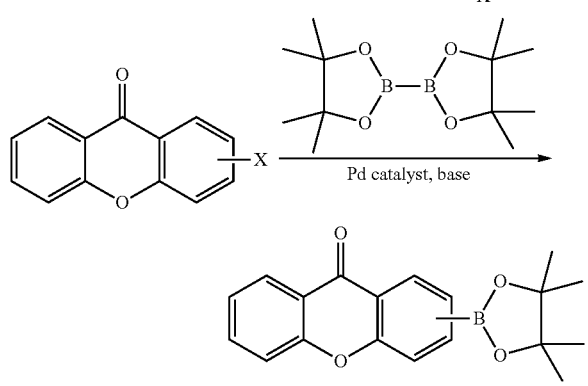

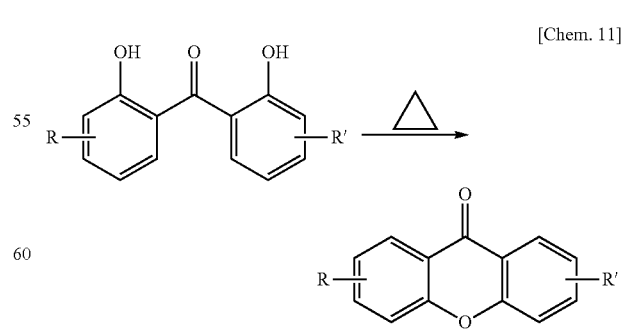

Alternatively, a dehydration condensation reaction may be conducted using a dihydroxybenzophenone derivative already having a reactive functional group or an aromatic ring group and the xanthone skeleton is formed later.

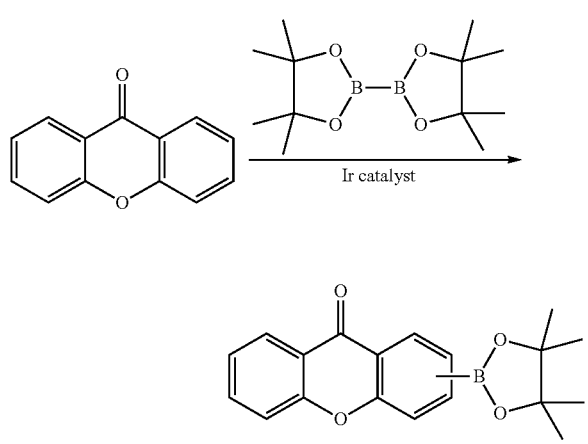

The halide, triflate, and boronic acid ester is used in a Suzuki coupling reaction. As a result, an alkyl group or an aromatic ring group can be introduced into the xanthone skeleton.

Desired substituents can be introduced into desired positions selected from among $R_1$ to $R_8$ in general formula [1] by freely combining the above-described basic reactions.

Regarding the Properties of Organic Light-Emitting Device

Next, the organic light-emitting device is described.

The organic light-emitting device according to an embodiment of the present invention includes a pair of opposing electrodes, namely, an anode and a cathode, and an organic compound layer interposed between the electrodes. A layer containing a phosphorescence-emitting material in the organic compound layer is the emission layer. The organic compound layer of the organic light-emitting device contains a xanthone compound represented by general formula [1].

An example of the structure of the organic light-emitting device is an anode/emission layer/cathode structure on a substrate. Another example is an anode/hole transport layer/electron transport layer/cathode structure. Still other examples include an anode/hole transport layer/emission layer/electron transport layer/cathode structure, an anode/hole injection layer/hole transport layer/emission layer/electron transport layer/cathode structure, and an anode/hole transport layer/emission layer/hole-exciton blocking layer/electron transport layer/cathode structure. These five structures of the multilayer organic light-emitting device are basic device structures and the structure of the organic light-emitting device containing a xanthone compound is not limited to these. Various other layer configurations may be employed, e.g., an insulating layer may be provided at the interface between an electrode and an organic compound layer, an adhesive layer or an interference layer may be provided, and the electron transport layer or the hole transport layer may be constituted by two layers having different ionization potentials.

The device may be of a top emission type that emits light from the substrate-side electrode or of a bottom emission type that emits light from the side opposite the substrate. The device may be of a type that emits light from both sides.

The xanthone compound can be used in an organic compound layer of an organic light-emitting device having any layer structure. Preferably, the xanthone compound is used in an electron transport layer, a hole-exciton blocking layer, or an emission layer. More preferably, the xanthone compound is used in at least one of the host material of an emission layer, a hole blocking layer, an electron transport layer, and an electron injection layer.

In general, a "hole blocking layer" is a layer that blocks holes. In the present invention, a layer adjacent to the cathode-side of the emission layer is referred to as a "hole blocking layer". The reason for this is as follows. The main purpose of using the xanthone compound is not to block holes but to use the xanthone compound in an electron transport layer. However, the xanthone compound is used in a layer located at the same position as a general hole blocking layer. Thus, in order to avoid confusion as to the position with the electron transport layer, the layer is referred to as a "hole blocking layer" from the position of the layer.

The emission layer of the organic light-emitting device may be constituted by two or more organic compounds, namely, a host material and a guest material. A guest material is an organic compound that emits light. One or more host materials may be used. In other words, the emission layer may contain two or more host materials in addition to the phosphorescence-emitting material. When only one host material is used, the xanthone compound may be used as this host material. When two or more host materials are used, the xanthone compound may be a host material having a smaller weight ratio than other host materials. In such a case, other host materials may have a hole transport property. This is because the xanthone compound has high electron transport property. When a material having a high hole transport property and a material having a high electron transport property are used together, the host material exhibits a substantial bipolar property in the emission layer.

The hole transport property of the emission layer may be enhanced by a guest material having a high hole transport property even when the hole transport property of the host material other than the xanthone compound is low. In such a case also, the xanthone compound may be used as a host material to adjust the carrier balance of the emission layer. Of the organic light-emitting devices shown in Table 3 below, the emission layer of the organic light-emitting device that has a host material 2 exhibits a high hole transport property due to properties of the host material 1 and the guest. The term "weight ratio" is a ratio relative to the total weight of the compounds constituting the emission layer.

The hole transport property and the electron transport property are regarded as "high" when the mobility is $10^{-4}$ $cm^2/(V \cdot s)$ or higher. The mobility can be measured by a time-of-flight (TOF) technique.

When two or more host materials are used, the xanthone compound having a smaller weight ratio than other host materials is referred to as a "host material" or, in some cases, an "assisting material".

The concentration of the guest material relative to the host material is 0.01 to 50 wt % and preferably 0.1 to 20 wt % relative to the total amount of the constituent materials of the emission layer. The concentration of the guest material is most preferably 10 wt % or less to prevent concentration quenching. The guest material may be homogeneously distributed in the entire layer composed of a host material, may be contained in the layer by having a concentration gradient, or may be contained in particular parts of the layer, thereby creating parts only the host material is contained. The emission color of the phosphorescence-emitting material is not particularly limited but may be blue to green with the maximum emission peak wavelength in the range of 440 to 530 nm.

In general, in order to prevent a decrease in emission efficiency caused by radiationless deactivation from $T_1$ of the host material of a phosphorescence-emitting device, the $T_1$ energy of the host material needs to be higher than the $T_1$ energy of the phosphorescence-emitting material which is a guest material.

The $T_1$ energy of the xanthone skeleton that functions as the center of the xanthone compound is 410 nm, which is higher than the $T_1$ energy of a blue phosphorescence-emitting material. Thus, when the xanthone compound is used in an emission layer or a nearby layer of a blue to green phosphorescence-emitting device, a phosphorescence-emitting device having a high emission efficiency can be obtained.

The xanthone compound has a low LUMO level. When the xanthone compound is used not only as an electron injection material or an electron transport material, or in a hole blocking layer but also as a host material of the emission layer, the driving voltage of the device can be lowered. This is because a low LUMO level decreases the electron injection barrier from the hole blocking layer or the electron transport layer adjacent to the cathode-side of the emission layer.

When a xanthone compound is used as an assisting material of the emission layer, the lifetime of the device can be extended when the xanthone compound has a LUMO level lower than that of the host material having a larger weight ratio. This is because electrons are trapped in the xanthone compound, thereby creating delocalized electronic distribution and delocalized recombination regions in the emission layer and thereby avoiding deterioration of the material occurring intensely in one portion of the emission layer.

When the xanthone compound is used as an electron transport material, an assisting material, or a host material in a phosphorescent light-emitting layer, a phosphorescence-emitting material used as a guest material is a metal complex such as an iridium complex, a platinum complex, a rhenium complex, a copper complex, an europium complex, or a ruthenium complex. Among these, an iridium complex having a high phosphorescent property is preferred. Two or more phosphorescence-emitting materials may be contained in the emission layer to assist transmission of excitons and carriers.

Examples of the iridium complex used as the phosphorescence-emitting material and examples of the host material are presented below. These examples do not limit the scope of the present invention.

[Chem. 12]

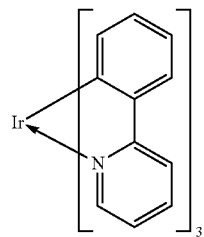
Ir-1

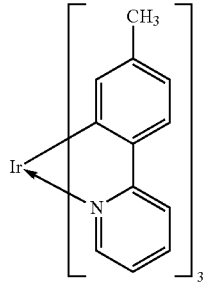
Ir-2

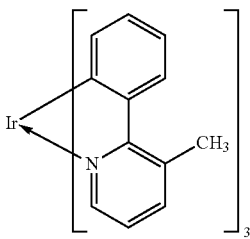
Ir-3

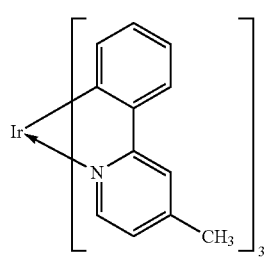
Ir-4

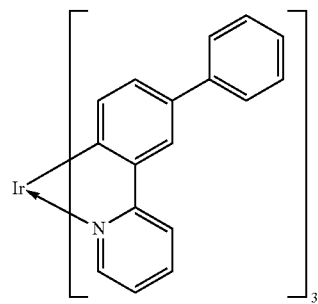
Ir-5

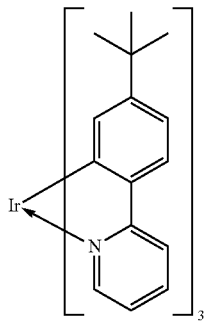
Ir-6

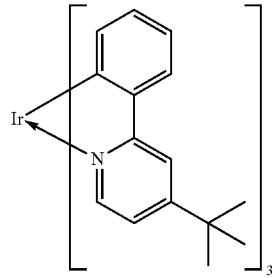
Ir-7

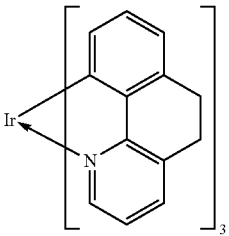
Ir-8

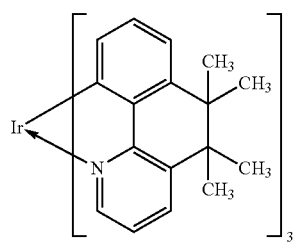
Ir-9

Ir-10
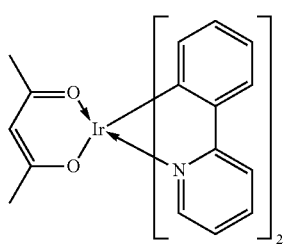
Ir-11
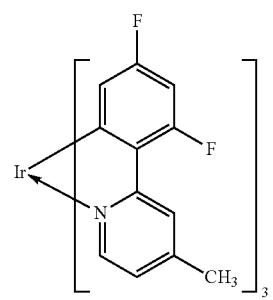
Ir-12
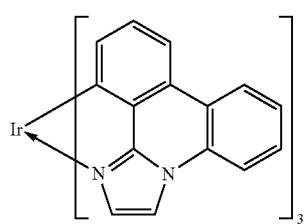
Ir-13
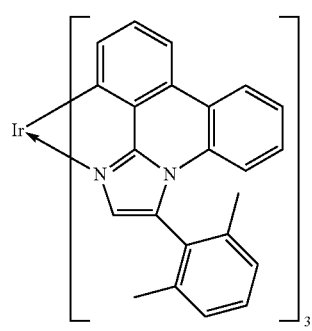
Ir-14
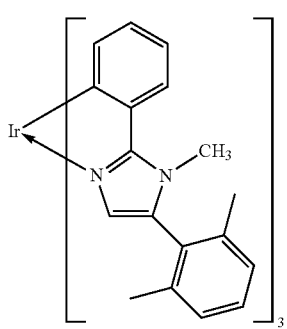
Ir-15
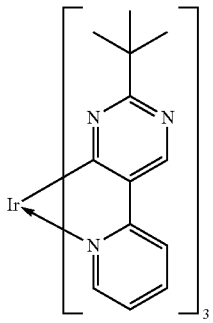
Ir-16
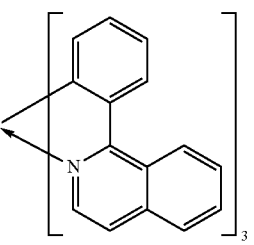
Ir-17
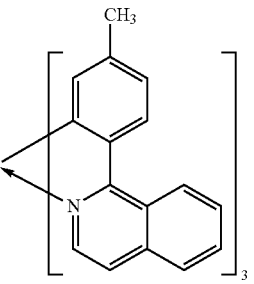
Ir-18
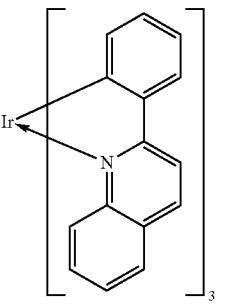
Ir-19
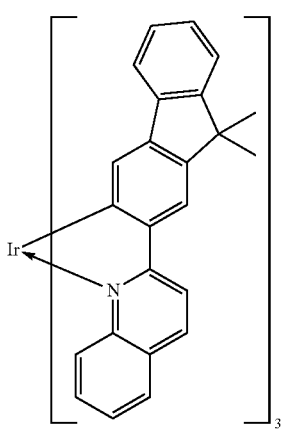

Ir-20
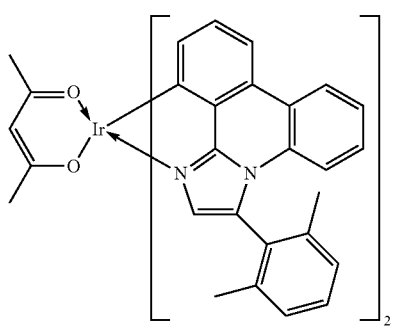
Ir-21
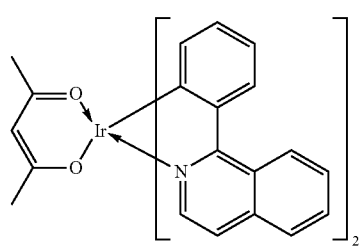
Ir-22
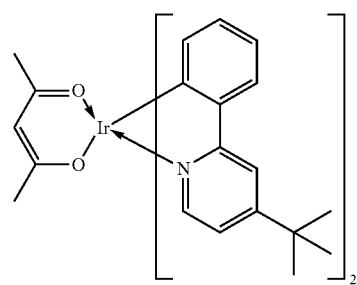
Ir-23
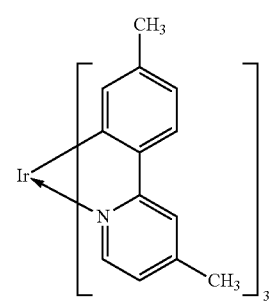
Ir-24
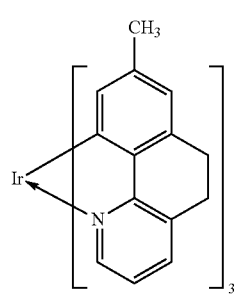
Ir-25
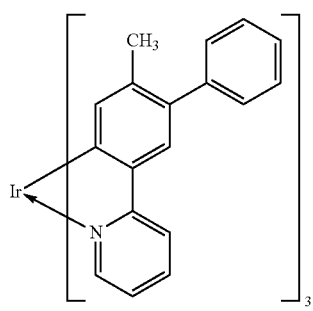
Ir-26
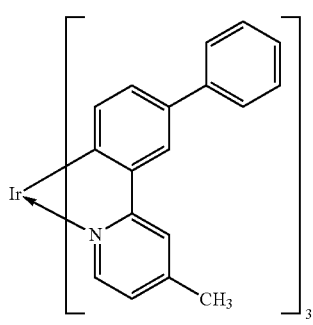
Ir-27
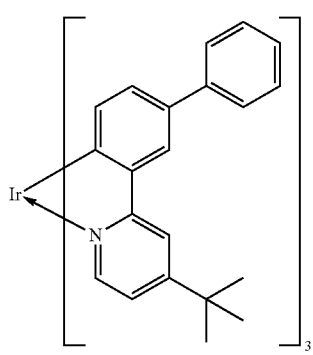
[Chem. 13]
I-1
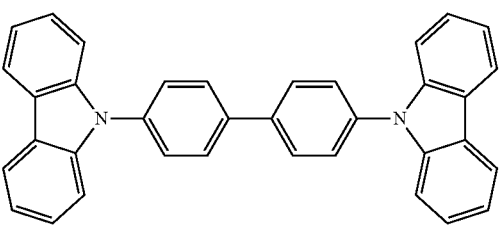
I-2
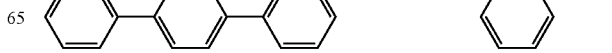

-continued

I-3
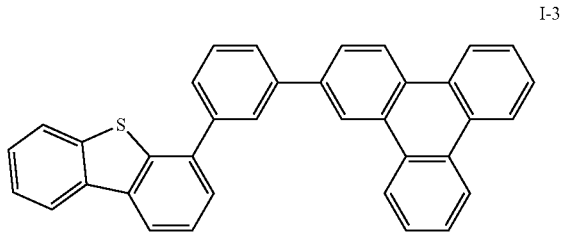

I-4
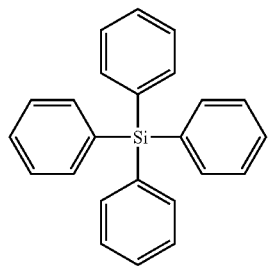

I-5
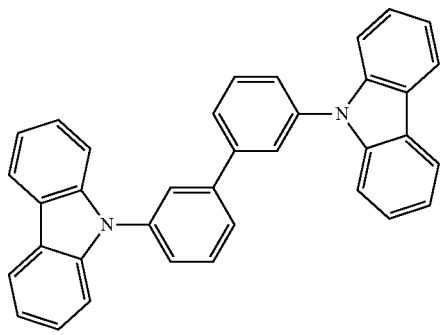

I-6
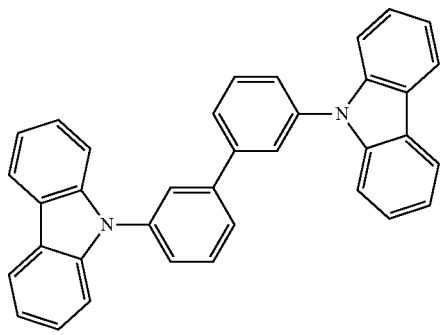

I-7

-continued

I-8
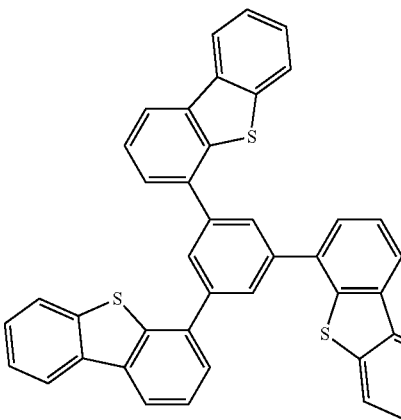

I-9
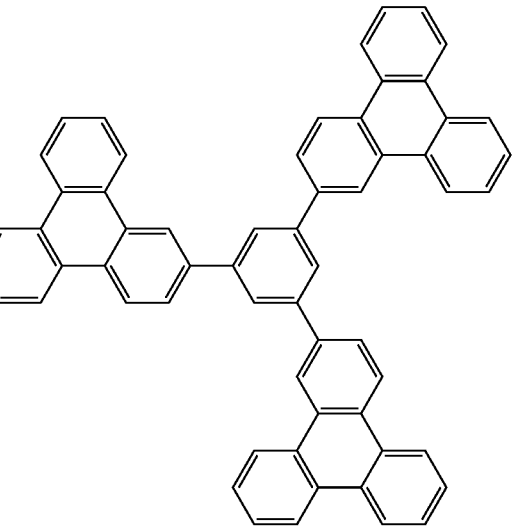

If needed, a low-molecular-weight or high-molecular-weight compound may be used in addition to the xanthone compound. For example, a hole injection or transport compound, a host material, a light-emitting compound, or an electron injection or transport compound may be used in combination.

Examples of these compounds are presented below.

The hole injection/transport material can be a material having a high hole mobility so that holes can be easily injected from the anode and the injected holes can be easily transported to the emission layer. Examples of the low- and high-molecular-weight materials having hole injection/transport property include triarylamine derivatives, phenylenediamine derivatives, stilbene derivatives, phthalocyanine derivatives, porphyrin derivatives, poly(vinyl carbazole), poly(thiophene), and other conductive polymers.

Examples of the light-emitting material mainly contributing to the light-emitting function include the phosphorescent light-emitting guest materials described above, derivative thereof, fused compounds (e.g., fluorene derivatives, naphthalene derivatives, pyrene derivatives, perylene derivatives, tetracene derivatives, anthracene derivatives, and rubrene), quinacridone derivatives, coumarin derivatives, stilbene derivatives, organic aluminum complexes such as tris(8-quinolinolato)aluminum, organic beryllium complexes, and polymer derivatives such as poly(phenylenevinylene) derivatives, poly(fluorene) derivatives, and poly(phenylene) derivatives.

The electron injection/transport material may be selected from materials to which electrons can be easily injected from the cathode and which can transport the injected electrons to the emission layer. The selection may be made by considering the balance with the hole mobility of the hole injection/transport material. Examples of the electron injection/transport material include oxadiazole derivatives, oxazole derivatives, pyrazine derivatives, triazole derivatives, triazine derivatives, quinoline derivatives, quinoxaline derivatives, phenanthroline derivatives, and organic aluminum complexes.

The anode material may have a large work function. Examples of the anode material include single metals such as gold, platinum, silver, copper, nickel, palladium, cobalt, selenium, vanadium, and tungsten or alloys thereof, and metal oxides such as tin oxide, zinc oxide, indium oxide, indium tin oxide (ITO), and indium zinc oxide. Conductive polymers such as polyaniline, polypyrrole, and polythiophene may also be used. These anode materials may be used alone or in combination. The anode may be constituted by one layer or two or more layers.

The cathode material may have a small work function. Examples of the cathode material include alkali metals such as lithium, alkaline earth metals such as calcium, and single metals such as aluminum, titanium, manganese, silver, lead, and chromium. The single metals may be combined and used as alloys. For example, magnesium-silver, aluminum-lithium, and aluminum-magnesium alloys and the like can be used. Metal oxides such as indium tin oxide (ITO) can also be used. These cathode materials may be used alone or in combination. The cathode may be constituted by one layer or two or more layers.

Layers containing the xanthone compound and other organic compounds in the organic light-emitting device are formed by the following processes. Typically, thin films are formed by vacuum vapor deposition, ionization deposition, sputtering, plasma, and coating using an adequate solvent (spin-coating, dipping, casting, a Langmuir Blodgett method, and an ink jet method). When layers are formed by vacuum vapor deposition or a solution coating method, crystallization is suppressed and stability over time can be improved. When a coating method is employed, an adequate binder resin may be additionally used to form a film.

Examples of the binder resin include, but are not limited to, polyvinylcarbazole resins, polycarbonate resins, polyester resins, ABS resins, acrylic resins, polyimide resins, phenolic resins, epoxy resins, silicone resins, and urea resins. These binder resins may be used alone as a homopolymer or in combination of two or more as a copolymer. If needed, known additives such as a plasticizer, an antioxidant, and an ultraviolet absorber may be used in combination.

Usage of Organic Light-Emitting Device

The organic light-emitting device of the embodiment may be used in a display apparatus or a lighting apparatus. The organic light-emitting device can also be used as exposure light sources of image-forming apparatuses and backlights of liquid crystal display apparatuses.

A display apparatus includes a display unit that includes the organic light-emitting device of this embodiment. The display unit has pixels and each pixel includes the organic light-emitting device of this embodiment. The display apparatus may be used as an image display apparatus of a personal computer, etc.

The display apparatus may be used in a display unit of an imaging apparatus such as digital cameras and digital video cameras. An imaging apparatus includes the display unit and an imaging unit having an imaging optical system for capturing images.

FIG. 1 is a schematic cross-sectional view of an image display apparatus having an organic light-emitting device in a pixel unit. In the drawing, two organic light-emitting devices and two thin film transistors (TFTs) are illustrated. One organic light-emitting device is connected to one TFT.

Referring to FIG. 1, in an image display apparatus 3, a moisture proof film 32 is disposed on a substrate 31 composed of glass or the like to protect components (TFT or organic layer) formed thereon. The moisture proof film 32 is composed of silicon oxide or a composite of silicon oxide and silicon nitride. A gate electrode 33 is provided on the moisture proof film 32. The gate electrode 33 is formed by depositing a metal such as Cr by sputtering.

A gate insulating film 34 covers the gate electrode 33. The gate insulating film 34 is obtained by forming a layer of silicon oxide or the like by a plasma chemical vapor deposition (CVD) method or a catalytic chemical vapor deposition (cat-CVD) method and patterning the film. A semiconductor layer 35 is formed over the gate insulating film 34 in each region that forms a TFT by patterning. The semiconductor layer 35 is obtained by forming a silicon film by a plasma CVD method or the like (optionally annealing at a temperature 290° C. or higher, for example) and patterning the resulting film according to the circuit layout.

A drain electrode 36 and a source electrode 37 are formed on each semiconductor layer 35. In sum, a TFT 38 includes a gate electrode 33, a gate insulating layer 34, a semiconductor layer 35, a drain electrode 36, and a source electrode 37. An insulating film 39 is formed over the TFT 38. A contact hole (through hole) 310 is formed in the insulating film 39 to connect between a metal anode 311 of the organic light-emitting device and the source electrode 37. A single-layer or a multilayer organic layer 312 that includes an emission layer and a cathode 313 are stacked on the anode 311 in that order to constitute an organic light-emitting device that functions as a pixel.

First and second protective layers 314 and 315 may be provided to prevent deterioration of the organic light-emitting device.

The switching element is not particularly limited and a metal-insulator-metal (MIM) element may be used instead of the TFT described above.

EXAMPLES

The present invention will now be described by using Examples which do not limit the scope of the invention.

Example 1

Synthesis of Example Compound A-4

[Chem. 14]

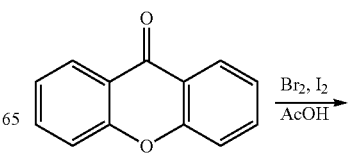

-continued

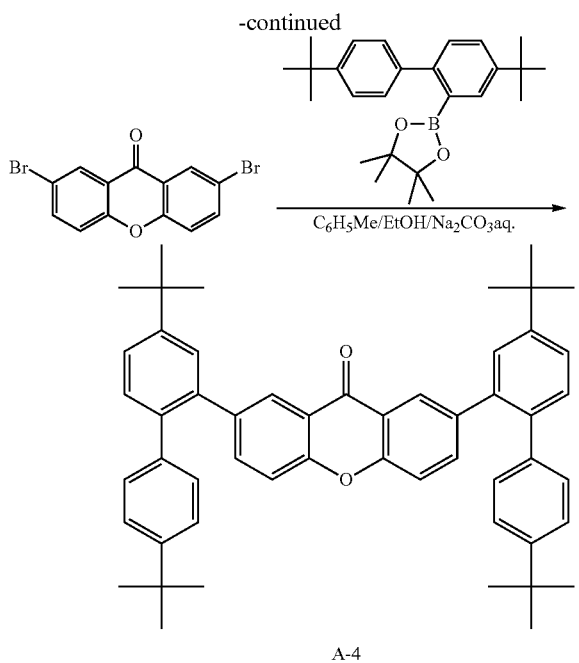

A-4

The following reagents and solvents were placed in a 100 mL round-bottomed flask.
Xanthone (Tokyo Chemical Industry Co., Ltd.): 5.0 g (26 mmol)
Bromine: 16 g (102 mmol)
Iodine: 50 mg (0.20 mmol)
Acetic acid: 20 mL The reaction solution was refluxed for 5 hours at 100° C. under heating and stirring in a nitrogen atmosphere. Upon completion of the reaction, chloroform and a saturated aqueous sodium sulfite solution were added to the reaction solution and stirring was continued until the color of bromine was lost. The organic layer was separated, washed with a saturated aqueous sodium carbonate solution, dried with magnesium sulfate, and filtered. The solvent in the filtrate was distilled away at a reduced pressure. The precipitated solid was purified with a silica gel column (toluene: 100%). As a result, 2.9 g (yield: 41%) of 2-bromoxanthone and 2.2 (yield: 25%) g of 2,7-dibromoxanthone were obtained.

The following reagents and solvents were placed in a 100 mL round-bottomed flask.
2,7-Dibromoxanthone: 0.70 g (2.0 mmol)
4,4,5,5-Tetramethyl-2-(4,4'-di-tert-butylbiphenyl-2-yl)-1,3,2-dioxaborolane: 1.9 g (4.8 mmol)
Tetrakis(triphenylphosphine) palladium(0): 0.23 g (0.20 mmol)
Toluene: 10 mL
Ethanol: 2 mL
2M Aqueous sodium carbonate solution: 5 mL The reaction solution was refluxed for 5 hours under heating and stirring in a nitrogen atmosphere. Upon completion of the reaction, the organic layer was separated, dried with magnesium sulfate, and filtered. The solvent in the filtrate was distilled away at a reduced pressure. The precipitated solid was purified with a silica gel column (chloroform:heptane=1:1). The resulting crystals was vacuum dried at 150° C. and purified by sublimation at $10^{-1}$ Pa and 300° C. As a result, 0.90 g (yield: 63%) of high-purity Example Compound A-4 was obtained.

The compound was subjected to matrix-assisted laser desorption ionization-time-of-flight mass spectroscopy (MALDI-TOF-MS), and 724.4 which was M+ of this compound was confirmed.

The structure of the compound was confirmed by proton nuclear magnetic resonance spectroscopy ($^1$H-NMR).

$^1$H-NMR ((CD$_3$)$_2$NCDO, 500 MHz) δ (ppm): 8.13 (2H, d), 7.63-7.44 (10H, m), 7.32 (4H, d), 7.15 (4H, d), 1.43 (18H, s), 1.25 (18H, s)

The T$_1$ energy of Example Compound A-4 was measured by the following process.

A phosphorescence spectrum of a diluted toluene solution ($1 \times 10^{-5}$ M) of Example Compound A-4 was measured in an Ar atmosphere at 77K and an excitation wavelength of 350 nm. The T$_1$ energy was calculated from the peak wavelength of the 0-0-band (first emission peak) of the obtained phosphorescence spectrum. The T$_1$ energy was 439 nm on a wavelength basis.

Example 2

Synthesis of Example Compound A-5

[Chem. 15]

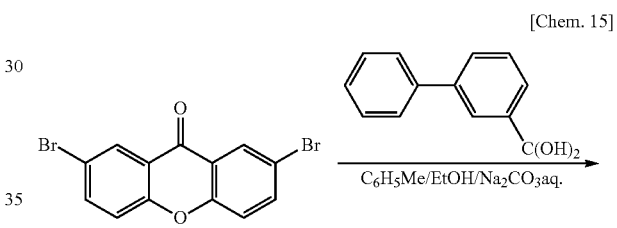

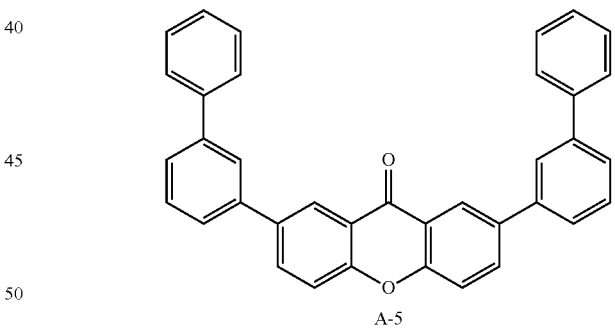

A-5

Example Compound A-5 was obtained as in Example 1 except that 4,4,5,5-tetramethyl-2-(4,4'-di-tert-butylbiphenyl-2-yl)-1,3,2-dioxaborolane used in Example 1 was replaced by 3-biphenylboronic acid.

M+ of this compound, 500.2, was confirmed by MALDI-TOF MS.

The structure of the compound was confirmed by $^1$H-NMR.

$^1$H-NMR (CDCl$_3$, 500 MHz) δ (ppm): 8.66 (2H, d), 8.06 (2H, dd), 7.91 (2H, bs), 7.72-7.66 (6H, m), 7.66-7.60 (4H, m), 7.57 (2H, t), 7.49 (4H, t), 7.39 (2H, t)

The T₁ energy of Example Compound A-5 was measured as in Example 1. The T₁ energy was 446 nm on a wavelength basis.

Example 3

Synthesis of Example Compound A-7

[Chem. 16]

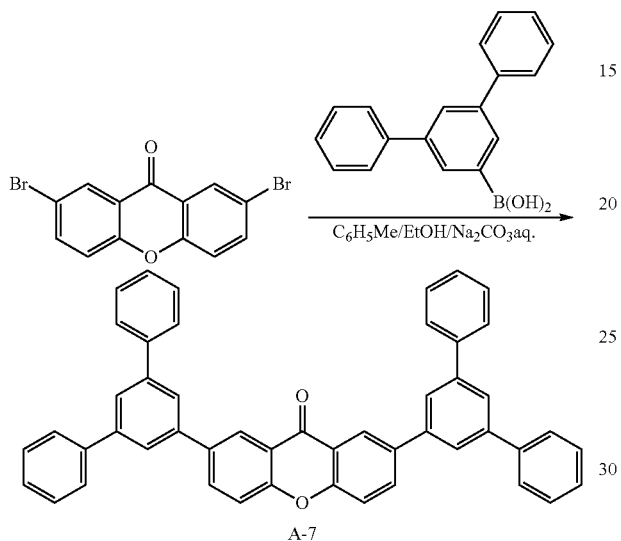

A-7

Example Compound A-7 was obtained as in Example 1 except that 4,4,5,5-tetramethyl-2-(4,4'-di-tert-butylbiphenyl-2-yl)-1,3,2-dioxaborolane used in Example 1 was replaced by 3,5-diphenylphenylboronic acid.

M⁺ of this compound, 652.2, was confirmed by MALDI-TOF MS.

The structure of the compound was confirmed by ¹H-NMR.

¹H-NMR (CDCl₃, 500 MHz) δ (ppm): 8.72 (2H, d), 8.13 (2H, dd), 7.90 (4H, d), 7.84 (2H, dd), 7.74 (8H, d), 7.68 (2H, d), 7.51 (8H, t), 7.42 (4H, t)

The T₁ energy of Example Compound A-7 was measured as in Example 1. The T₁ energy was 447 nm on a wavelength basis.

Example 4

Synthesis of Example Compound A-12

[Chem. 17]

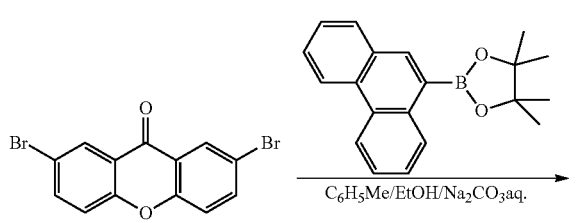

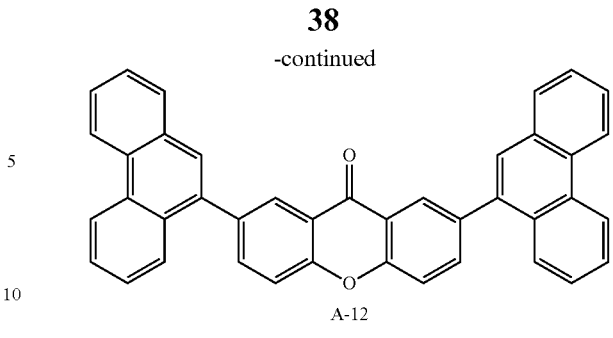

A-12

Example Compound A-12 was obtained as in Example 1 except that 4,4,5,5-tetramethyl-2-(4,4'-di-tert-butylbiphenyl-2-yl)-1,3,2-dioxaborolane used in Example 1 was replaced by 4,4,5,5-tetramethyl-2-(phenanthren-9-yl)-1,3,2-dioxaborolane.

M⁺ of this compound, 548.2, was confirmed by MALDI-TOF MS.

The structure of the compound was confirmed by ¹H-NMR.

¹H-NMR (CDCl₃, 500 MHz) δ (ppm): 8.82 (2H, d), 8.76 (2H, d), 8.60 (2H, d), 7.98 (2H, dd), 7.96-7.90 (4H, m), 7.79 (2H, s), 7.76-7.68 (6H, m), 7.65 (2H, dd), 7.58 (2H, dd)

The T₁ energy of Example Compound A-12 was measured as in Example 1. The T₁ energy was 502 nm on a wavelength basis.

Example 5

Synthesis of Example Compound A-15

[Chem. 18]

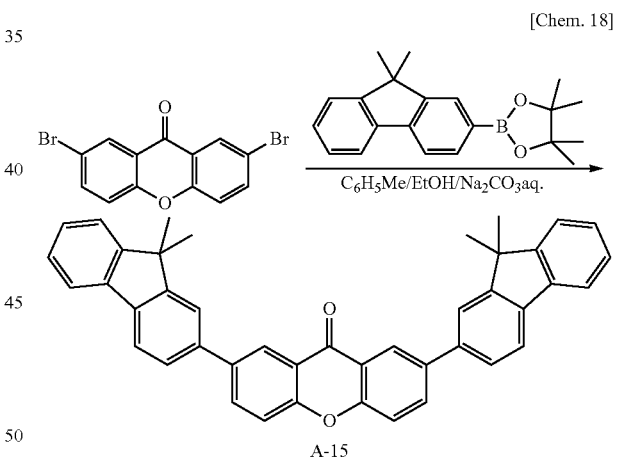

A-15

Example Compound A-15 was obtained as in Example 1 except that 4,4,5,5-tetramethyl-2-(4,4'-di-tert-butylbiphenyl-2-yl)-1,3,2-dioxaborolane used in Example 1 was replaced by 4,4,5,5-tetramethyl-2-(9,9-dimethylfluoren-2-yl)-1,3,2-dioxaborolane.

M⁺ of this compound, 580.2, was confirmed by MALDI-TOF MS.

The structure of the compound was confirmed by ¹H-NMR.

¹H-NMR (CDCl₃, 500 MHz) δ (ppm): 8.68 (2H, d), 8.09 (2H, dd), 7.84 (2H, d), 7.80-7.76 (4H, m), 7.69 (2H, dd), 7.65 (2H, d), 7.48 (2H, dd), 7.40-7.33 (4H, m), 1.58 (12H, s)

The T₁ energy of Example Compound A-15 was measured as in Example 1. The T₁ energy was 487 nm on a wavelength basis.

Example 6

Synthesis of Example Compound A-16

[Chem. 19]

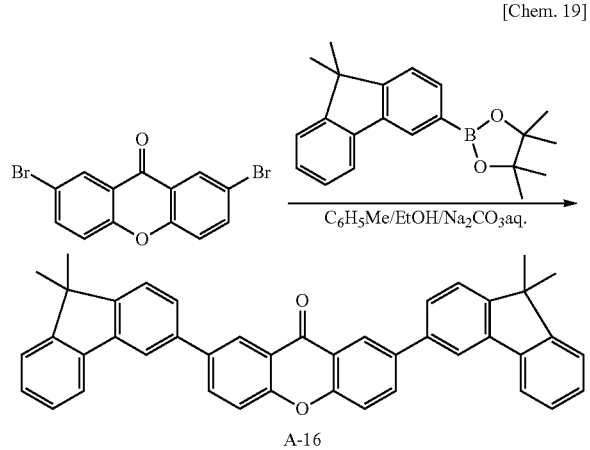

A-16

Example Compound A-16 was obtained as in Example 1 except that 4,4,5,5-tetramethyl-2-(4,4'-di-tert-butylbiphenyl-2-yl)-1,3,2-dioxaborolane used in Example 1 was replaced by 4,4,5,5-tetramethyl-2-(9,9-dimethylfluoren-3-yl)-1,3,2-dioxaborolane.

$M^+$ of this compound, 580.2, was confirmed by MALDI-TOF MS.

The structure of the compound was confirmed by $^1$H-NMR.

$^1$H-NMR (CDCl$_3$, 500 MHz) δ (ppm): 8.69 (2H, d), 8.10 (2H, dd), 8.06 (2H, d), 7.85 (2H, d), 7.66 (4H, d), 7.56 (2H, d), 7.48 (2H, d), 7.42-7.34 (4H, m), 1.55 (12H, s)

The T$_1$ energy of Example Compound A-16 was measured as in Example 1. The T$_1$ energy was 450 nm on a wavelength basis.

Example 7

Synthesis of Example Compound A-22

[Chem. 20]

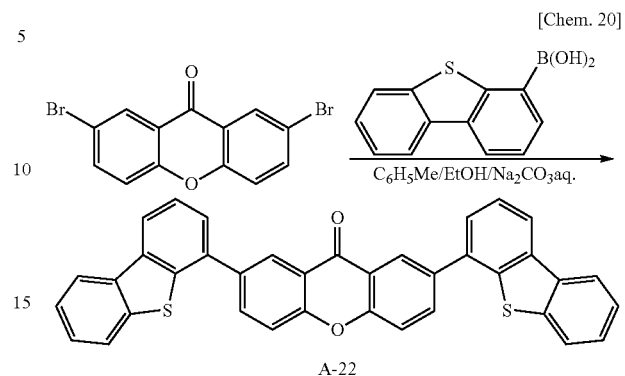

A-22

Example Compound A-22 was obtained as in Example 1 except that 4,4,5,5-tetramethyl-2-(4,4'-di-tert-butylbiphenyl-2-yl)-1,3,2-dioxaborolane used in Example 1 was replaced by 4-dibenzothienylboronic acid.

$M^+$ of this compound, 560.1, was confirmed by MALDI-TOF MS.

The structure of the compound was confirmed by $^1$H-NMR.

$^1$H-NMR (CDCl$_3$, 500 MHz) δ (ppm): 8.76 (2H, d), 8.24-8.18 (6H, m), 7.88-7.84 (2H, m), 7.73 (2H, d), 7.64-7.58 (4H, m), 7.52-7.46 (4H, m)

The T$_1$ energy of Example Compound A-22 was measured as in Example 1. The T$_1$ energy was 450 nm on a wavelength basis.

Example 8

Synthesis of Example Compound A-32

[Chem. 21]

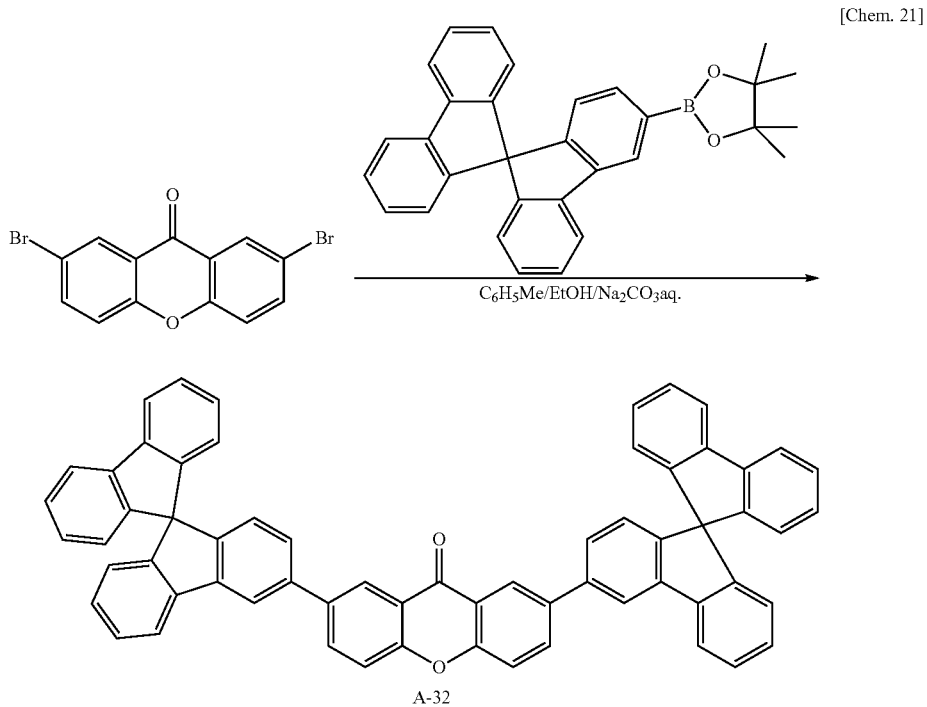

A-32

Example Compound A-32 was obtained as in Example 1 except that 4,4,5,5-tetramethyl-2-(4,4'-di-tert-butylbiphenyl-2-yl)-1,3,2-dioxaborolane used in Example 1 was replaced by 4,4,5,5-tetramethyl-2-(9,9'-spirobi[fluoren]-3-yl)-1,3,2-dioxaborolane.

M$^+$ of this compound, 824.3, was confirmed by MALDI-TOF MS.

The structure of the compound was confirmed by $^1$H-NMR.

$^1$H-NMR (CDCl$_3$, 500 MHz) δ (ppm): 8.70 (2H, d), 8.18 (2H, d), 8.08 (2H, dd), 7.97 (2H, d), 7.88 (4H, d), 7.65 (2H, d), 7.46-7.38 (8H, m), 7.18-7.12 (6H, m), 6.86 (2H, d), 6.80 (4H, d), 6.77 (2H, d)

The T$_1$ energy of Example Compound A-32 was measured as in Example 1. The T$_1$ energy was 452 nm on a wavelength basis.

Examples 9 and 10

Synthesis of Example Compounds A-23 and A-31

Each Example Compound was obtained as in Example 1 except that 4,4,5,5-tetramethyl-2-(4,4'-di-tert-butylbiphenyl-2-yl)-1,3,2-dioxaborolane used in Example 1 was replaced by a boronic acid derivative shown in Table 3.

Each Example Compound was identified by MALDI-TOF MS.

TABLE 3

| Example compound | | Boronic acid derivative | MALDI-T OF MS (M$^+$) |
|---|---|---|---|
| Example 9 | A-23 | (dibenzothiophene-B(OH)$_2$) | 560.1 |
| Example 10 | A-31 | (9,9'-spirobifluorene-Bpin) | 824.3 |

Example 11

Synthesis of Example Compound B-1

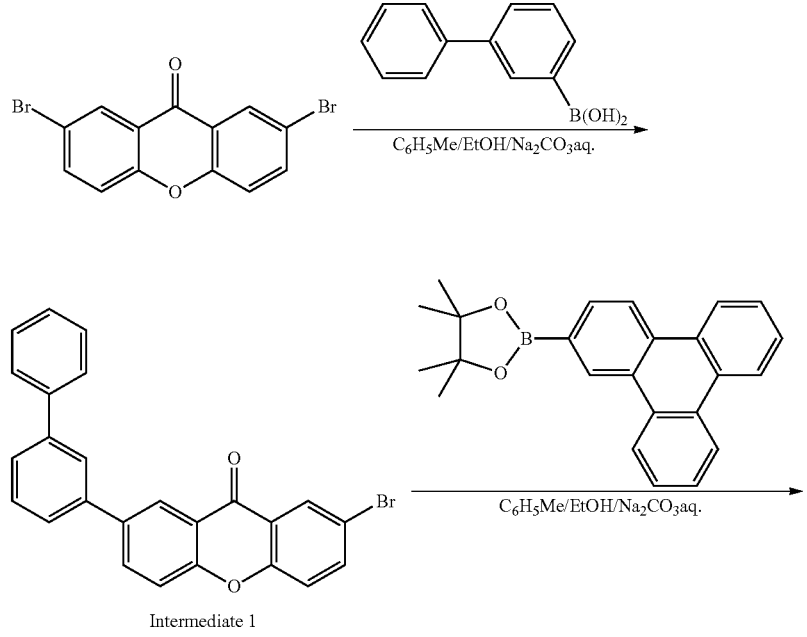

Intermediate 1

[Chem. 22]

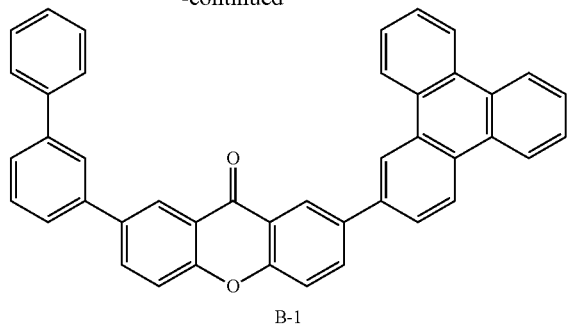

B-1

The following reagents and solvents were placed in a 100 mL round-bottomed flask.

2,7-Dibromoxanthone: 0.70 g (2.0 mmol)

3-Biphenylboronic acid: 0.40 g (2.0 mmol)

Tetrakis(triphenylphosphine) palladium(0): 0.23 g (0.20 mmol)

Toluene: 10 mL

Ethanol: 2 mL

2M Aqueous sodium carbonate solution: 3 mL

The reaction solution was refluxed for 3 hours under heating and stirring in a nitrogen atmosphere. Upon completion of the reaction, the organic layer was separated, dried with magnesium sulfate, and filtered. The solvent in the filtrate was distilled away at a reduced pressure. The precipitated solid was purified with a silica gel column (chloroform:heptane=1:1). As a result, 0.62 g (yield: 72%) of intermediate 1 was obtained.

The following reagents and solvents were placed in a 100 mL round-bottomed flask.

Intermediate 1: 0.62 g (1.5 mmol)

4,4,5,5-Tetramethyl-2-(triphenylen-2-yl)-1,3,2-dioxaborolane: 0.64 g (1.8 mmol)

Tetrakis(triphenylphosphine) palladium(0): 0.17 g (0.15 mmol)

Toluene: 10 mL

Ethanol: 2 mL

2M Aqueous sodium carbonate solution: 3 mL

The reaction solution was refluxed for 3 hours under heating and stirring in a nitrogen atmosphere. Upon completion of the reaction, the precipitated solid was filtered and washed with water, methanol, and acetone. The obtained solid was dissolved in chlorobenzene under heating and insolubles were removed by hot filtration. The solvent in the filtrate was distilled away under a reduced pressure and the precipitated solid was recrystallized in a chlorobenzene/heptane system. The resulting crystals were vacuum dried at 150° C. and purified by sublimation at $10^{-1}$ Pa and 360° C. As a result, 0.67 g (yield: 78%) of high-purity Example Compound B-1 was obtained.

$M^+$ of this compound, 574.2, was confirmed by MALDI-TOF MS.

Example 12

Synthesis of Example Compound B-4

[Chem. 23]

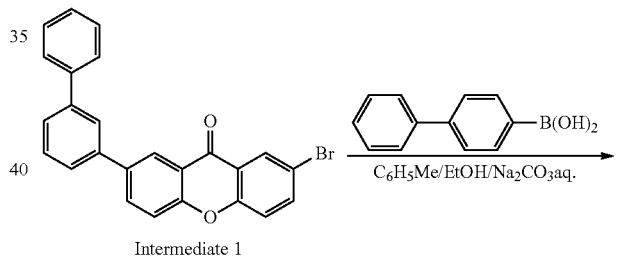

Intermediate 1

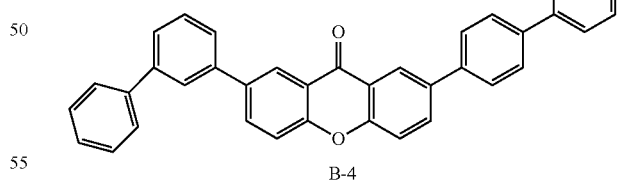

B-4

Example Compound B-4 was obtained as in Example 11 except that 4,4,5,5-tetramethyl-2-(triphenylen-2-yl)-1,3,2-dioxaborolane used in Example 11 was replaced by 4-biphenylboronic acid.

$M^+$ of this compound, 500.2, was confirmed by MALDI-TOF MS.

Example 13

Synthesis of Example Compound C-2

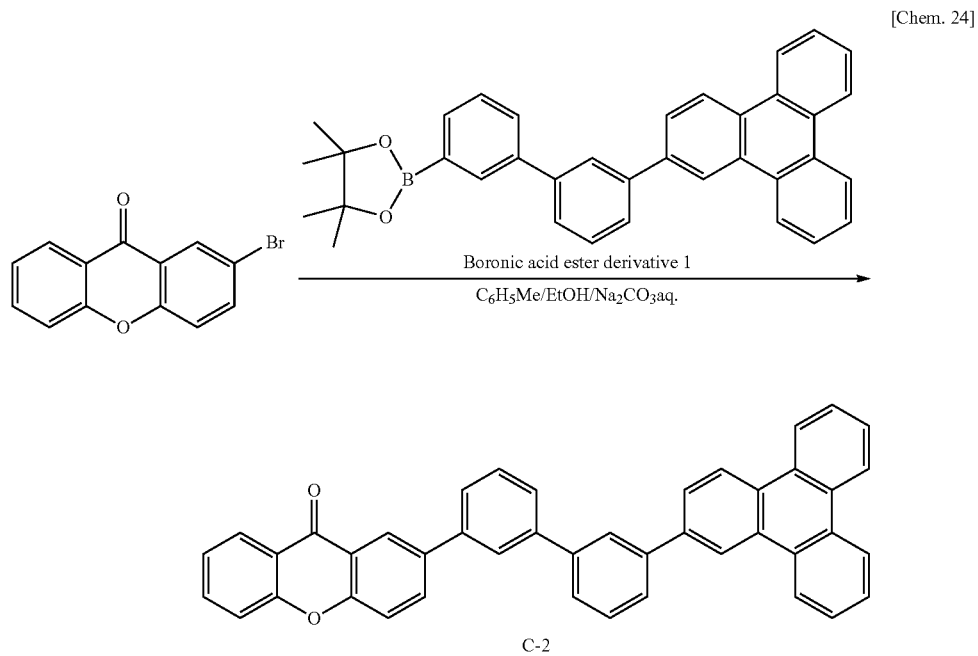

The following reagents and solvents were placed in a 100 mL round-bottomed flask.
- 2-Bromoxanthone: 0.55 g (2.0 mmol)
- Boronic acid ester derivative 1: 1.2 g (2.4 mmol)
- Tetrakis(triphenylphosphine) palladium(0): 0.23 g (0.20 mmol)
- Toluene: 15 mL
- Ethanol: 3 mL
- 2M Aqueous sodium carbonate solution: 5 mL The reaction solution was refluxed for 3 hours under heating and stirring in a nitrogen atmosphere. Upon completion of the reaction, the precipitated solid was filtered and washed with water, methanol, and acetone. The obtained solid was dissolved in chlorobenzene under heating and insolubles were removed by hot filtration. The solvent in the filtrate was distilled away under a reduced pressure and the precipitated solid was recrystallized in a chlorobenzene/heptane system. The resulting crystals were vacuum dried at 150° C. and purified by sublimation at $10^{-1}$ Pa and 370° C. As a result, 0.93 g (yield: 81%) of high-purity Example Compound C-2 was obtained.

$M^+$ of this compound, 574.2, was confirmed by MALDI-TOF MS.

Examples 14 to 17

Synthesis of Example Compounds C-5, C-7, C-14, and C-16

Each Example Compound was obtained as in Example 13 except that the boronic acid ester derivative 1 used in Example 13 was replaced by a boronic acid ester derivative shown in Table 4.

Each Example Compound was identified by MALDI-TOF MS.

TABLE 4

| Example compound | | Boronic acid derivative | MALDI-T OF MS ($M^+$) |
|---|---|---|---|
| Example 14 | C-5 | | 540.2 |

TABLE 4-continued

| Example compound | | Boronic acid derivative | MALDI-T OF MS (M+) |
|---|---|---|---|
| Example 15 | C-7 | 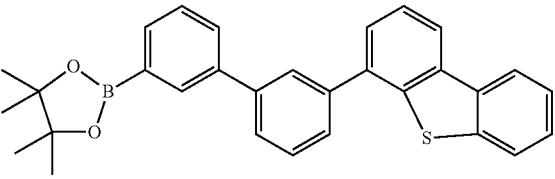 [SMILES: CC1(C)OB(c2cccc(-c3cccc(-c4cccc5c4sc4ccccc45)c3)c2)OC1(C)C] | 530.1 |
| Example 16 | C-14 | 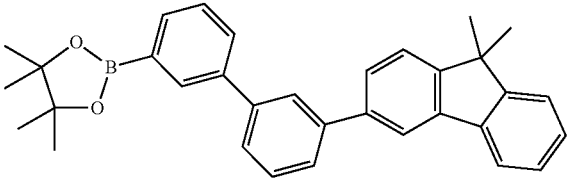 [SMILES: CC1(C)c2ccccc2-c2cc(-c3cccc(-c4cccc(B5OC(C)(C)C(C)(C)O5)c4)c3)ccc21] | 540.2 |
| Example 17 | C-16 | 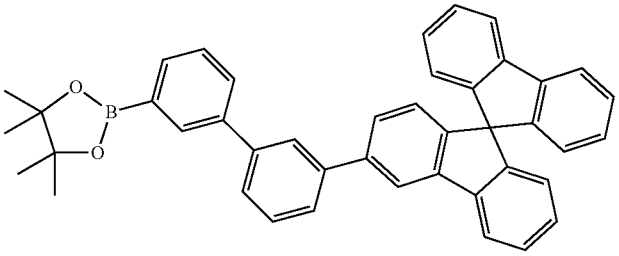 [SMILES: CC1(C)OB(c2cccc(-c3cccc(-c4ccc5c(c4)-c4ccccc4C54c5ccccc5-c5ccccc54)c3)c2)OC1(C)C] | 662.2 |

Example 18

Production of Organic Light-Emitting Device

In Example 18, an organic light-emitting device having an anode/hole transport layer/emission layer/hole blocking layer/electron transport layer/cathode structure on a substrate was produced by the following process.

Indium tin oxide (ITO) was sputter-deposited on a glass substrate to form a film 120 nm in thickness functioning as an anode. This substrate was used as a transparent conductive support substrate (ITO substrate). Organic compound layers and electrode layers below were continuously formed on the ITO substrate by vacuum vapor deposition under resistive heating in a $10^{-5}$ Pa vacuum chamber. The process was conducted so that the area of the opposing electrodes was 3 mm².

Hole transport layer (40 nm) HTL-1

Emission layer (30 nm), host material 1: I-1, host material 2: none, guest material: Ir-1 (10 wt %)

Hole blocking (HB) layer (10 nm) A-4

Electron transport layer (30 nm) ETL-1

Metal electrode layer 1 (0.5 nm) LiF

Metal electrode layer 2 (100 nm) Al

[Chem. 25]

HTL-1

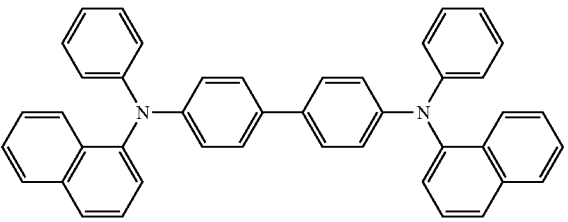

Ir-1

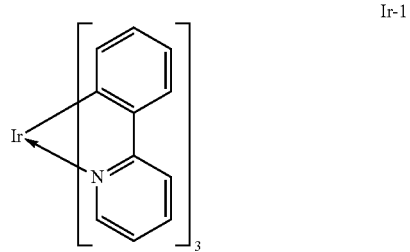

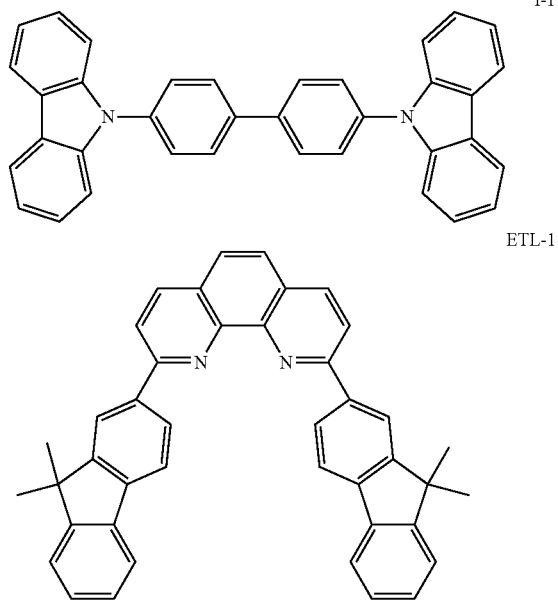

A protective glass plate was placed over the organic light-emitting device in dry air to prevent deterioration caused by adsorption of moisture and sealed with an acrylic resin adhesive. Thus, an organic light-emitting device was produced.

The current-voltage characteristic of the organic light-emitting device was measured with 2700 series ammeter produced by Keithley Instruments Inc., and the emission luminance was measured with BM7-fast produced by TOPCON CORPORATION. A voltage of 5.0 V was applied to the ITO electrode functioning as a positive electrode and an aluminum electrode functioning as a negative electrode. The emission efficiency was 55 cd/A and emission of green light with a luminance of 2000 cd/m² was observed. The CIE color coordinate of the device was (x, y)=(0.31, 0.63).

The lifetime (length of time the luminance decreased 20% from the initial value) of the device when a current was passed at 40 mA/cm² was 65 hours.

Examples 19 to 37

Devices were produced as in Example 18 except that the HB material, the host material 1, the host material 2 (15 wt %), and the guest material (10 wt %) were changed. The devices were evaluated as in Example 18. Emission of green light was observed from all devices. The emission efficiency at 2000 cd/m², the applied voltage, and the lifetime (length of time the luminance decreased 20% from the initial value) when a current is passed at 40 mA/cm² are presented in Table 5.

Comparative Examples 1 and 2

Devices were produced as in Example 18 except that ETL-1 was used as the HB material and the host material 1 and the guest material (10 wt %) were changed. The devices were evaluated as in Example 18. Emission of green light was observed from both devices. The emission efficiency at 2000 cd/m², the applied voltage, and the lifetime (length of time the luminance decreased 20% from the initial value) when a current is passed at 40 mA/cm² are presented in Table 5.

TABLE 5

| Example No. | HB material | Host material 1 | Host material 2 | Guest material | Emission efficiency (cd/A) | Voltage (V) | Lifetime (h) |
|---|---|---|---|---|---|---|---|
| 19 | A-4 | I-1 | A-4 | Ir-1 | 63 | 5.1 | 70 |
| 20 | A-5 | I-8 | None | Ir-23 | 56 | 5.4 | 95 |
| 21 | A-5 | I-3 | A-5 | Ir-3 | 61 | 5.6 | 115 |
| 22 | A-7 | I-7 | None | Ir-24 | 55 | 5.3 | 85 |
| 23 | A-7 | I-8 | A-7 | Ir-27 | 58 | 5.8 | 120 |
| 24 | A-12 | I-1 | None | Ir-1 | 55 | 5.0 | 70 |
| 25 | A-12 | I-2 | A-12 | Ir-1 | 57 | 5.2 | 80 |
| 26 | A-15 | I-2 | None | Ir-1 | 55 | 5.4 | 75 |
| 27 | A-15 | I-1 | A-15 | Ir-3 | 60 | 5.6 | 100 |
| 28 | A-16 | I-1 | None | Ir-1 | 58 | 5.5 | 95 |
| 29 | A-16 | I-3 | A-15 | Ir-4 | 62 | 5.7 | 80 |
| 30 | A-22 | I-8 | A-22 | Ir-27 | 58 | 5.6 | 105 |
| 31 | ETL-1 | I-9 | A-4 | Ir-26 | 55 | 5.3 | 100 |
| 32 | ETL-1 | I-8 | A-7 | Ir-23 | 54 | 5.6 | 95 |
| 33 | ETL-1 | I-7 | A-32 | Ir-25 | 54 | 5.2 | 95 |
| 34 | B-1 | I-9 | None | Ir-2 | 51 | 4.9 | 115 |
| 35 | ETL-1 | I-7 | B-4 | Ir-4 | 54 | 5.5 | 105 |
| 36 | C-7 | I-9 | C-7 | Ir-7 | 57 | 5.1 | 115 |
| 37 | ETL-1 | I-8 | C-16 | Ir-6 | 55 | 5.3 | 85 |
| Comparative Example 1 | ETL-1 | I-1 | None | Ir-1 | 36 | 5.8 | 20 |
| Comparative Example 2 | ETL-1 | I-2 | None | Ir-5 | 42 | 5.6 | 35 |

Examples 38 to 44

Devices were produced as in Example 18 except that the HB material, the host material 1, the host material 2 (15 wt %), and the guest material (10 wt %) were changed. The devices were evaluated as in Example 18. The emission efficiency at 2000 cd/m², the applied voltage, and the color of emission are presented in Table 6.

TABLE 6

| Example No. | HB material | Host material 1 | Host material 2 | Guest material | Emission efficiency (cd/A) | Voltage (V) | Emission color |
|---|---|---|---|---|---|---|---|
| 38 | A-4 | I-5 | None | Ir-13 | 11 | 6.4 | Blue |
| 39 | A-5 | I-5 | A-5 | Ir-13 | 10 | 6.6 | Blue |
| 40 | A-32 | I-5 | A-16 | Ir-15 | 16 | 6.2 | Blue-green |
| 41 | B-4 | I-4 | None | Ir-15 | 14 | 6.3 | Blue-green |
| 42 | B-4 | I-5 | A-22 | Ir-15 | 16 | 6.2 | Blue-green |
| 43 | C-5 | I-6 | C-5 | Ir-13 | 10 | 6.7 | Blue |
| 44 | C-16 | I-5 | C-16 | Ir-13 | 12 | 6.6 | Blue |

The results show that when the xanthone compound is used as an electron transport material or an emission layer material in a phosphorescence-emitting device, good emission efficiency and long device lifetime can be achieved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-101299, filed Apr. 26, 2010 and Japanese Patent Application No. 2010-228893, filed Oct. 8, 2010, which are hereby incorporated by reference herein in their entirety.

The invention claimed is:
1. An organic light-emitting device comprising:
an anode;
a cathode; and
an emission layer comprising an organic compound and interposed between the anode and the cathode,
wherein the organic light-emitting device contains a xanthone compound represented by general formula [1]:

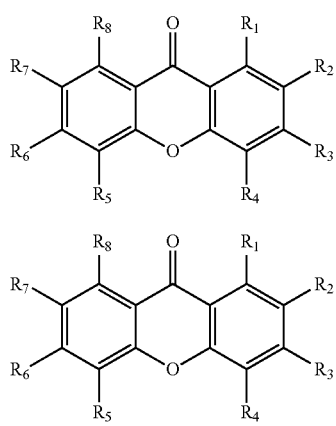

where $R_1$ to $R_8$ are each independently selected from a hydrogen atom, an alkyl group having 1 to 4 carbon atoms, a substituted or unsubstituted phenyl group, a substituted or unsubstituted naphthyl group, a substituted or unsubstituted phenanthryl group, a substituted or unsubstituted fluorenyl group, a substituted or unsubstituted triphenylenyl group, a substituted or unsubstituted chrysenyl group, a substituted or unsubstituted dibenzofuranyl group, and a substituted or unsubstituted dibenzothienyl group, provided that at least one of the $R_1$ to $R_8$ are selected from the group consisting of the phenyl group, the naphthyl group, the phenanthryl group, the fluorenyl group, the triphenylenyl group, the chrysenyl group, the dibenzofuranyl group, and the dibenzothienyl group.

2. The organic light-emitting device according to claim 1, wherein, $R_1$, $R_3$ to $R_6$, and $R_8$ in general formula [1] are each a hydrogen atom.

3. The organic light-emitting device according to claim 1, wherein the emission layer contains an iridium complex as a guest material.

4. A display apparatus comprising:
the organic light-emitting device according to claim 1; and
a switching element connected to the organic light-emitting device.

5. The organic light-emitting device according to claim 1, where $R_1$ to $R_8$ are selected from the group consisting of the phenyl group, the naphthyl group, the phenanthryl group, the fluorenyl group, the triphenylenyl group, the chrysenyl group, the dibenzofuranyl group, and the dibenzothienyl group.

6. A lighting apparatus comprising the organic light-emitting device according to claim 1.

7. An image-forming apparatus comprising an exposure light source, the exposure light source comprising the organic light-emitting device according to claim 1.

8. An exposure light source of an image-forming apparatus comprising the organic light-emitting device according to claim 1.

9. An organic light emitting device according to claim 1, the emission layer comprising a host material and a guest material,
wherein the host material is a xanthone compound represented by general formula [1].

10. The organic light-emitting device according to claim 9, wherein the emission layer comprises a plurality of host materials, one of which is the xanthone compound represented by general formula [1].

11. A display apparatus comprising:
the organic light-emitting device according to claim 9; and
a switching element connected to the organic light-emitting device.

12. A lighting apparatus comprising the organic light-emitting device according to claim 9.

13. An image-forming apparatus comprising an exposure light source, the exposure light source comprising the organic light- emitting device according to claim 9.

14. An organic light-emitting device comprising:
an anode;
a cathode; and
an emission layer comprising an organic compound and interposed between the anode and the cathode,
wherein a xanthone compound represented by general formula [1] is contained in at least one of an electron transport layer adjacent to the emission layer and an electron injection layer interposed between the electron transport layer and the cathode;

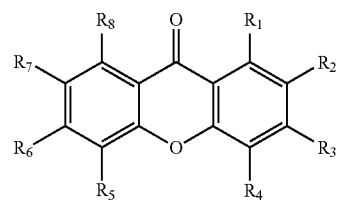

where $R_1$ to $R_8$ are each independently selected from a hydrogen atom, an alkyl group having 1 to 4 carbon atoms, a substituted or unsubstituted phenyl group, a substituted or unsubstituted naphthyl group, a substituted or unsubstituted phenanthryl group, a substituted or unsubstituted fluorenyl group, a substituted or unsubstituted triphenylenyl group, a substituted or unsubstituted chrysenyl group, a substituted or unsubstituted dibenzofuranyl group, and a substituted or unsubstituted dibenzothienyl group.

15. A display apparatus comprising:
the organic light-emitting device according to claim 14; and
a switching element connected to the organic light-emitting device.

16. A lighting apparatus comprising the organic light-emitting device according to claim 14.

17. An image-forming apparatus comprising an exposure light source, the exposure light source comprising the organic light- emitting device according to claim 14.

18. An organic device comprising;
an anode;
a cathode;
an organic compound layer disposed between the anode and the cathode;

wherein the organic compound layer comprising a xanthone compound represented by general formula [1]

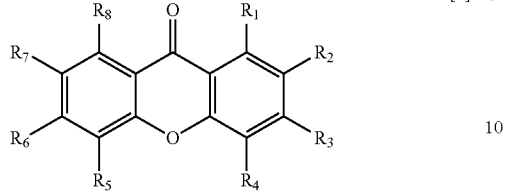

[1]

where $R_1$ to $R_8$ are each independently selected from a hydrogen atom, an alkyl group having 1 to 4 carbon atoms, a substituted or unsubstituted phenyl group, a substituted or unsubstituted naphthyl group, a substituted or unsubstituted phenanthryl group, a substituted or unsubstituted fluorenyl group, a substituted or unsubstituted triphenylenyl group, a substituted or unsubstituted chrysenyl group, a substituted or unsubstituted dibenzofuranyl group, and a substituted or unsubstituted dibenzothienyl group, provided that at least one of the R1 to R8 are selected from the group consisting of the phenyl group, the naphthyl group, the phenanthryl group, the fluorenyl group, the triphenylenyl group, the chrysenyl group, the dibenzofuranyl group, and the dibenzothienyl group.

* * * * *